United States Patent [19]

Goth

[11] Patent Number: 4,691,219
[45] Date of Patent: Sep. 1, 1987

[54] SELF-ALIGNED POLYSILICON BASE CONTACT STRUCTURE

[75] Inventor: George R. Goth, Poughkeepsie, N.Y.

[73] Assignee: International Business Machines Corporation, Armonk, N.Y.

[21] Appl. No.: 843,938

[22] Filed: Mar. 24, 1986

Related U.S. Application Data

[63] Continuation of Ser. No. 454,919, Dec. 30, 1982, which is a continuation-in-part of Ser. No. 167,184, Jul. 8, 1980, Pat. No. 4,400,865.

[51] Int. Cl.[4] .............................. H01L 29/72
[52] U.S. Cl. ........................ 357/34; 357/59; 357/49; 357/54; 357/50; 357/35
[58] Field of Search ............ 357/34, 59 H, 49, 52, 357/43, 50, 54, 54 N, 35, 59 R, 59 G

[56] References Cited

U.S. PATENT DOCUMENTS

| | | | |
|---|---|---|---|
| 3,597,667 | 8/1971 | Horn | 357/34 X |
| 3,847,687 | 11/1974 | Davidsohn | 357/59 X |
| 4,075,045 | 2/1978 | Rideout | 148/187 |
| 4,148,055 | 4/1979 | Edlinger et al. | 357/44 |
| 4,160,991 | 7/1979 | Anantha et al. | 357/49 |
| 4,178,674 | 12/1979 | Liu et al. | 29/571 |
| 4,231,819 | 11/1980 | Raffel et al. | 357/50 X |
| 4,234,362 | 11/1980 | Riseman | 357/59 X |
| 4,318,751 | 3/1982 | Horng | 357/50 X |
| 4,319,932 | 3/1982 | Jambotkar | 357/59 X |
| 4,392,149 | 7/1983 | Horng et al. | 357/59 H X |
| 4,408,388 | 10/1983 | Kameyama | 357/59 H X |
| 4,508,579 | 4/1985 | Goth et al. | 357/59 H X |

FOREIGN PATENT DOCUMENTS 1535086 12/1978 United Kingdom .

OTHER PUBLICATIONS

Takemoto et al, "A vertically Isolated Self-Aligned Transistor," *Conference: Int. Electron. Devices Meeting,* Washington, D.C., Dec. 7–9, 1980, pp. 708–709.

Dumke et al., "Self-Aligned Silicon MFSFET Process," IBM Tech. Disclosure Bulletin, vol. 22, No. 8A, Jan. 1980, pp. 3418–3420.

Ning et al., "Bipolar Transistor Structure with Extended Metal Base Contacts and Diffused or Implanted Emitter", IBM Tech. Disc. Bulletin, vol. 22, No. 5, Oct. 1979, pp. 2123–2126.

Briska et al., "Method of Producing Schottky Contacts", IBM Tech. Disclosure Bulletin, vol. 22, No. 11, Apr. 1980, pp. 4964–4965.

*Primary Examiner*—Andrew J. James
*Assistant Examiner*—William A. Mintel
*Attorney, Agent, or Firm*—Douglas A. Lashmit

[57] ABSTRACT

An integrated bipolar transistor having a self-aligned polysilicon base contact is formed by depositing a first doped polysilicon layer and a silicon nitride passivating layer on the surface of a semiconductor substrate having an isolated collector region therein. An opening is formed in the first polysilicon and silicon nitride layers over the collector to expose the surface of the semiconductor substrate. The base region is formed through the opening and a conformal silicon nitride coating is then deposited on the wall of the opening and over the surface of the semiconductor substrate within the opening. A second polysilicon layer is formed on the silicon nitride passivating layer. The second polysilicon layer is reactive ion etched, leaving a polysilicon sidewall on the wall of the opening while removing the rest of the second polysilicon layer. The polysilicon sidewall is then oxidized, and an emitter is formed through the opening. The bipolar transistors of the present invention have high density, high speed and improved device to device uniformity because thinning or shorting of the passivating layer on the polysilicon layer is prevented.

1 Claim, 52 Drawing Figures

SELF-ALIGNED POLYSILICON BASE CONTACT STRUCTURE

This application is a continuation of copending application Ser. No. 454,919, filed on Dec. 30, 1982, which is a continuation-in-part of application Ser. No. 167,184, filed on July 8, 1980, now U.S. Pat. No. 4,400,865.

BACKGROUND OF THE INVENTION

This invention relates to integrated semiconductor devices, and more particularly to an integrated bipolar transistor having a self-aligned polysilicon base contact.

Semiconductor integrated circuits have substantially increased in density in the past decade. However, there is an increasing demand for greater complexities, higher switching speeds and smaller devices for new applications such as microprocessors and minicomputers. As integrated circuits become more dense, a major problem is the electrical contacts to the various elements and devices in the integrated circuit. Large numbers of contacts are necessary for making the requisite device connections. These contacts must be isolated from one another and from other devices, and must be properly aligned.

Recent attempts to provide electrical contacts for integrated devices have employed highly doped polycrystalline silicon (hereinafter, polysilicon) as the conductive contact layer. For example, polysilicon contact techniques have been employed to form the base contacts of high density integrated bipolar transistors. However, the currently known polysilicon base contact process has not been completely satisfactory, as described below.

A state of the art process for forming an integrated bipolar transistor having a self-aligned polysilicon base contact begins with a semiconductor substrate having an isolated collector region formed therein. A polysilicon layer is deposited on the semiconductor substrate and a silicon nitride passivating layer is formed on the polysilicon layer. An opening is formed in the polysilicon and silicon nitride layers, over the collector region, through which the base is implanted. A thick conformal layer of chemical vapor deposited (CVD) silicon dioxide is then deposited on the polysilicon layer including the opening therein. This silicon dioxide layer is reactive ion etched (RIE) in an ambient of $CF_4$ or $CF_4+H_2$ to remove the horizontal portion thereof over the polysilicon layer and within the opening, while leaving a vertical silicon dioxide sidewall on the wall of the opening. An emitter is then implanted through the opening in the silicon dioxide sidewall, and a contact to the emitter is made.

While theoretically providing a bipolar transistor having a self-aligned polysilicon base contact, the above state of the art process has been difficult to implement because the RIE step requires two etch rate ratios which are mutually unattainable with currently known RIE techniques. More particularly, the RIE step requires a high etch rate ratio (ERR) of silicon dioxide to silicon so that the emitter region is not thinned when the silicon dioxide layer is reactive ion etched. Emitter region thinning, (and the resultant thinning of the later implanted base region) decreases transistor gain and provides excessive parameter variation from transistor to transistor.

On the other hand, the RIE step requires a high ERR of silicon dioxide to silicon nitride, so that the silicon nitride passivation layer on top of the polysilicon layer is not etched. Silicon nitride passivation layer etching causes thinning of the passivation layer and may even create shorts or pinholes therein. When metal lines are subsequently run over the thinned passivation layer, the excessive capacitance of the thinned layer degrades the speed of, and creates cross talk among, the metal lines. Moreover, if a short occurs between the polysilicon base contact and the metal lines due to a pinhole in the thinned silicon nitride passivation layer, the integrated circuit will not be usable.

Thus, the state of the art polysilicon base contact process requires an RIE technique having a high ERR of silicon dioxide to silicon and a high ERR of silicon dioxide to silicon nitride. A high ERR of silicon dioxide to silicon nitride itself is difficult to attain using currently known RIE techniques. Moreover, no currently known reactive ion etching technique satisfies the simultaneous high ERR requirement. Thus, known RIE ambients (i.e., $CF_4$, $CF_4+H_2$, $Ar+Cl_2$, $SF_6+Cl_2$, etc.) present a compromise which results in etching into the emitter, etching into the silicon nitride passivation layer, or both.

SUMMARY OF THE INVENTION

It is a primary object of this invention to provide an improved self-aligned polysilicon base contact structure.

It is another object of the invention to provide a bipolar transistor having a polysilicon base contact, using currently available semiconductor fabrication techniques.

It is a further object of the invention to provide a bipolar transistor having a polysilicon base contact wherein the emitter and base regions are not thinned during the fabrication process.

It is still a further object of the invention to provide a bipolar transistor having a polysilicon base contact wherein the passivation layer above the polysilicon base contact is not thinned or shorted during the fabrication process.

It is another object of the invention to provide a bipolar transistor having a self-aligned polysilicon base contact and a self-aligned emitter contact by means of dielectric studs on the emitter opening sidewalls.

These and other objects are accomplished by a method of forming an integrated bipolar transistor having a self-aligned polysilicon base contact by depositing a first doped polysilicon layer and a silicon nitride passivating layer on the bare surface of a semiconductor substrate having an isolated collector region therein. An opening is formed in the first polysilicon and silicon nitride layers over the collector to expose the surface of the semiconductor substrate. The intrinsic base region is implanted or diffused into the surface of the semiconductor substrate through the opening, and a conformal silicon nitride coating is deposited on the wall of the opening and over the surface of the semiconductor substrate within the opening. (This conformal silicon nitride coating may also be deposited on the original silicon nitride passivating layer over the first polysilicon layer). A second polysilicon layer is then formed on the silicon nitride passivating layer over the first polysilicon layer and within the opening therein. The second polysilicon layer is reactive ion etched in an ambient of $Ar+Cl_2$ or $SF_6+Cl_2+He$ to remove the portion thereof over the surface of the semiconductor substrate within the opening, while retaining a polysilicon sidewall on the wall of the opening. The polysilicon sidewall is then oxidized to convert at least a part thereof into an insulating layer of silicon dioxide. Finally, the emitter region is implanted or diffused into the semiconductor substrate through the opening and the structure is annealed to diffuse the base and emitter regions to their proper depths.

In the present invention, a conformal coating of silicon nitride is present over the entire surface of the semiconductor prior to RIE. The silicon nitride acts as an etch stop for the second polysilicon layer RIE. The second polysilicon layer RIE thus need only have a high ERR of (poly)silicon to silicon nitride. This requirement is easily satisfied by many known techniques such as RIE in an ambient of $Ar+Cl_2$ or $SF_6+Cl_2+He$. The silicon nitride conformal coating also acts as a barrier to prevent oxidation of the first polysilicon layer and the surface of the substrate within the opening thereof during thermal oxidation of the polysilicon sidewall.

The self-aligned polysilicon base contact process of the present invention obviates the requirement for a high ERR of silicon dioxide to silicon nitride. Moreover, it obviates the dual high ERR requirement of silicon dioxide to silicon nitride and silicon dioxide to silicon. The transistors formed as a result of this process have a three layer sidewall structure on the polysilicon base contact comprising a silicon nitride layer on the wall of the polysilicon base contact, followed by polysilicon and silicon dioxide layers. The silicon nitride passivating layer atop the polysilicon base contact is not thinned or shorted. The emitter and base regions are likewise not thinned.

Although described in conjunction with integrated bipolar transistor fabrication, the method of the present invention may be employed whenever it is necessary to form an insulator on the wall of an opening in a polysilicon layer which lies on the surface of a semiconductor substrate. The insulator may be formed by forming a conformal silicon nitride layer on the wall of the opening and over the surface of the semiconductor substrate within the opening. A second polysilicon layer is then deposited on the silicon nitride conformal coating. The second polysilicon layer is directionally etched to remove the portion thereof over the surface of the semiconductor substrate within the opening, while retaining the portion thereof on the wall of the opening. Finally, the second polysilicon layer on the wall of the opening is oxidized to convert at least a portion thereof into silicon dioxide.

The integrated structures thus formed have high density, high speed and greater device to device uniformity because thinning or shorting of the passivating layer on the polysilicon layer is prevented.

DETAILED DESCRIPTION OF THE PREFERRED EMBODIMENTS

Figure 1:
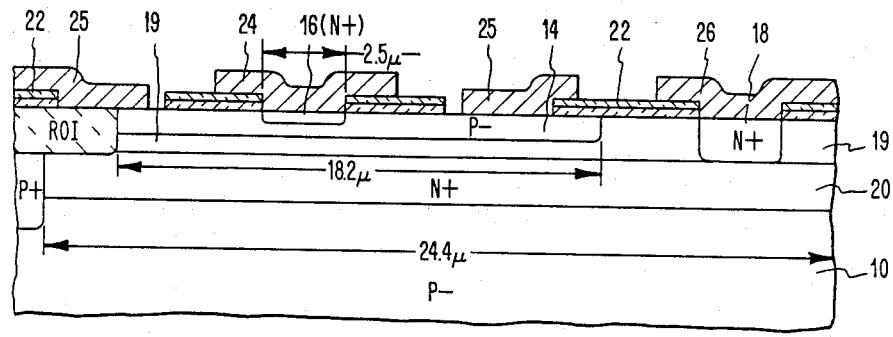
FIGS. 1 and 2 schematically illustrate known prior art, bipolar transistor structures.
Figure 2:
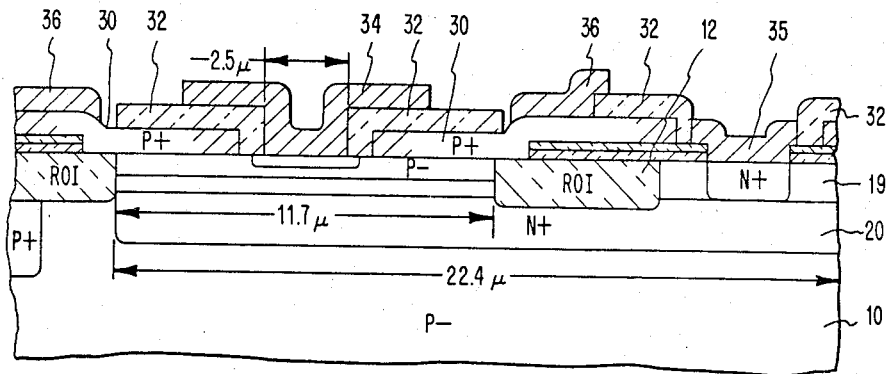
Figure 3:
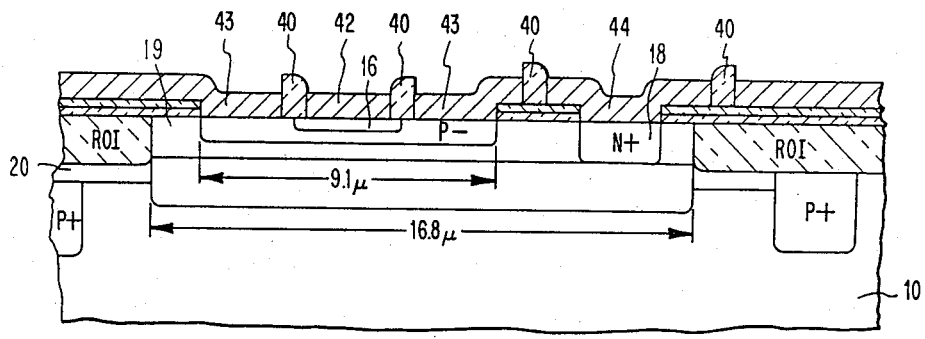
FIG. 3 schematically illustrates one embodiment of a bipolar transistor structure according to the present invention.

Referring now more particularly to FIGS. 1, 2 and 3, the two prior art structures shown in FIGS. 1 and 2 can be compared with a similar structure in the self-aligned metal technology of the present invention. The FIGURES show a bipolar transistor structure wherein a 2.5 micron or micrometer minimum line width is utilized. Each of the bipolar transistors shown in FIGS. 1, 2 and 3 are NPN transistors, and are formed on a P− substrate 10. Like numbers indicated like structures in each of these figures.

FIG. 1 shows a prior art widely used NPN bipolar device that uses dielectric isolation and can be better understood by reference to the Peltzer U.S. Pat. No. 3,648,125 and I. Magdo, et al, patent application Ser. No. 150,609, filed June 7, 1971. Briefly, the bipolar transistor device is dielectrically isolated by recess oxide insulation regions, ROI. The ROI isolates regions of monocrystalline silicon containing bipolar transistors from other like regions. The base region 14 contains emitter region 16. An N+ collector reach-through region 18 contacts the N+ epitaxial layer 20 which is located on the P− substrate 10. Surface insulator regions 22 are present to isolate the emitter electrode 24, base electrodes 25 and collector electrode 26 from surface regions not desired to be contacted.

The FIG. 2 prior art structure which is known as the polycrystalline base type structure may be more fully understood with reference to the T. H. Ning, et al, U.S. Pat. No. 4,157,269 and the N. G. Anantha, et al U.S. Pat. No. 4,160,991. Briefly the structure includes recess oxide isolation regions, ROI, which isolate surface monocrystalline silicon regions from one another and which isolate the base-emitter region from the reach-through region. The FIG. 2 structure is the same as the FIG. 1 device, except that the ROI region 12 isolates the base-emitter region from the N+ reach-through area of the epitaxial layer 19, and the surface contacts to elements of the NPN transistor are different. Rather than the metal contacts 22, 25, 26, as in the FIG. 1 device, there are polycrystalline silicon contacts 30 to the base region. A silicon dioxide layer 32 is formed over the polysilicon contacts 30. Openings are made in the silicon dioxide layer 32 to contact the emitter and collector reach-through elements of the transistor and to contact the polycrystalline silicon base contact 30. An emitter contact 34, a collector contact 35 and a base contact 36 are formed by a single deposition and lithographic steps.

The FIG. 3 bipolar transistor structure is similar to the transistor of FIGS. 1 and 2, and has like structures as indicated by like numbers, except for the surface metallurgy and isolation regions. A pattern of narrow dimensioned dielectric regions 40 are located on the surface of the silicon body. The base 14, emitter 16 and collector reach-through 18 regions are formed in epitaxial layers 19 and 20 as in the structures of FIGS. 1 and 2. Electrical contacts to these regions fill the spaces between the narrow dimensioned dielectric regions 40. The emitter contact is 42, the base contact is 43 and the collector reach-through contact is 44.

The devices may be compared since the same minimum 2.5 micron line width was used to produce each of the structures. The size of the devices is indicated in the figures in microns.

Figure 15A:
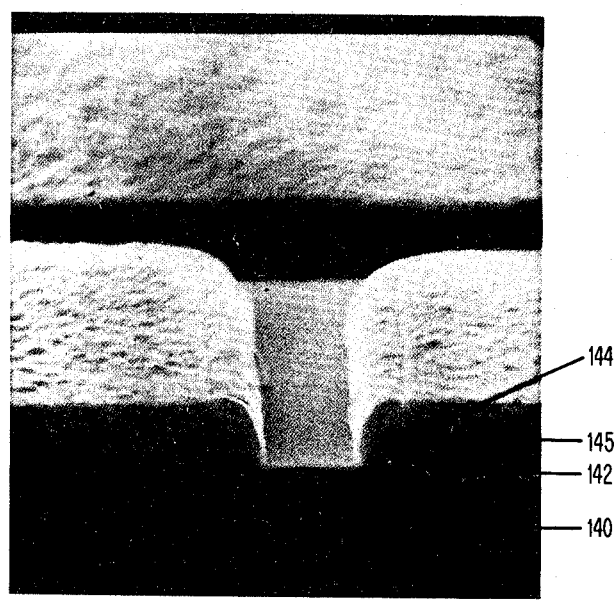
FIGS. 15A-15F are enlarged photographic illustrations of method steps actually used in forming structures according to an Example of the present invention.
Figure 15B:
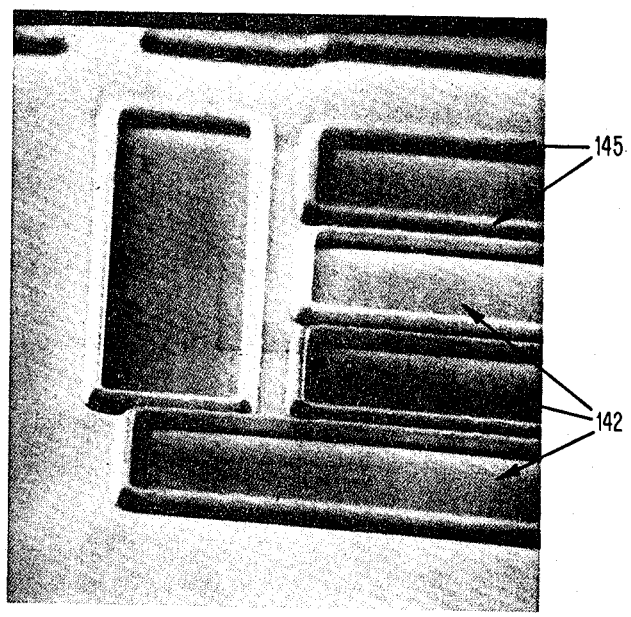
Figure 15C:
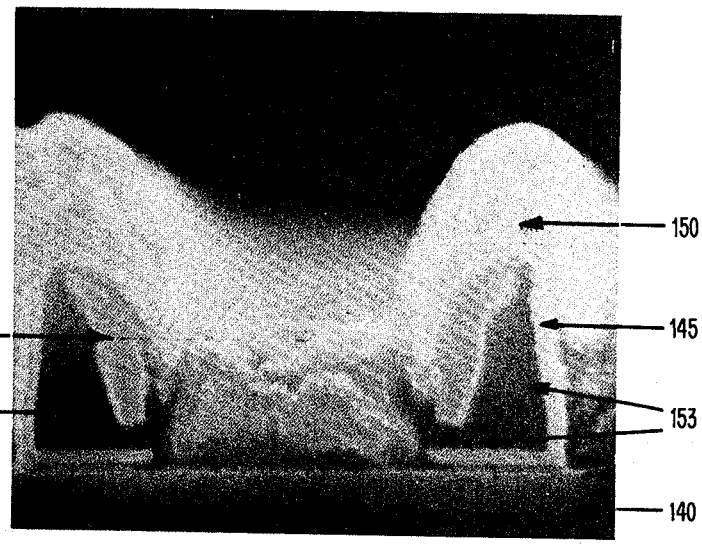
Figure 15D:
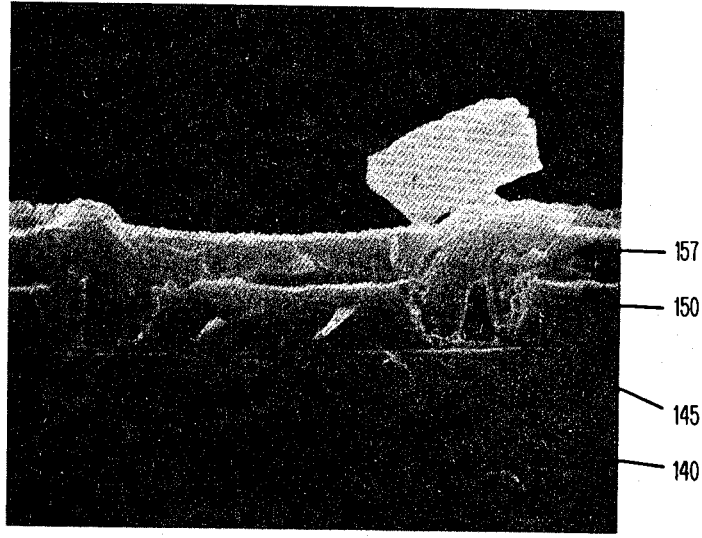
Figure 15E:
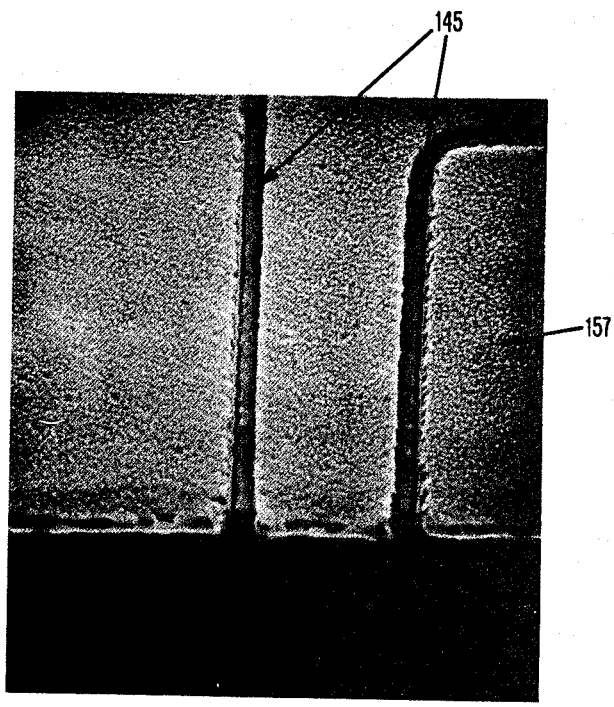
Figure 15F:
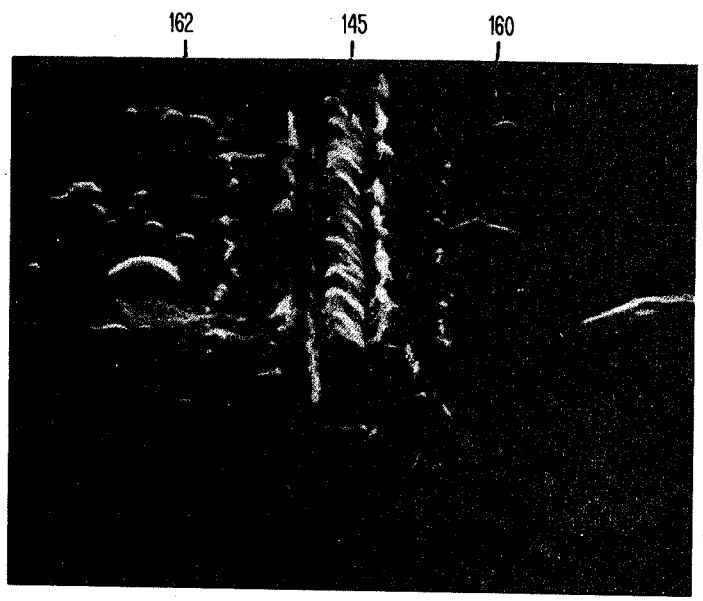
Figure 16:
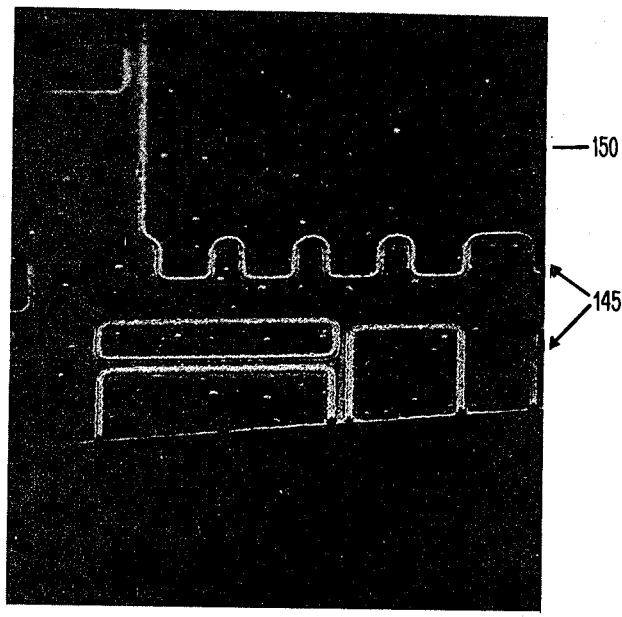
FIG. 16 is a test pattern structure made according to the process of the FIGS. 15A-15F.

It will be noted that the length of the subcollector reduces from 24.4 micrometers in FIG. 1 to 22.4 in FIG. 2 and 16.8 in FIG. 3. Also, length of the base window reduces from 18.2 micrometers in FIG. 1 to 11.7 micrometers in FIG. 2 and 9.1 micrometers in FIG. 3. The table below summarizes the key parameters of the devices shown in FIGS. 1, 2 and 3.

Figure 4:
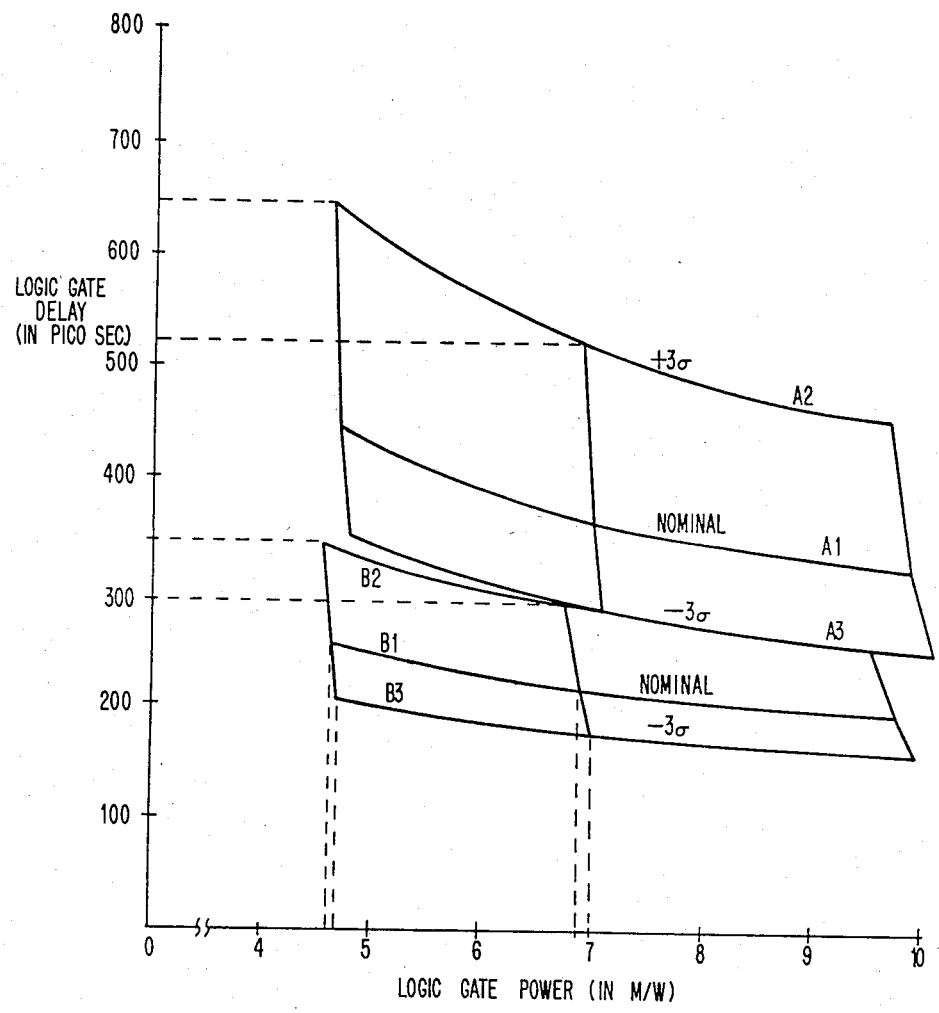
FIG. 4 illustrates a comparison of a current switch emitter follower logic gate function between the prior art structures shown in FIGS. 1 and 2 and the FIG. 3 embodiment.

| Parameter | FIG. 1 | FIG. 2 | FIG. 3 |
| --- | --- | --- | --- |
| $C_{CB}$ @ 0 volts (pf) | .074 | .045 | .029 |
| $C_{CS}$ @ 0 volts (pf) | .017 | .017 | .014 |
| $R_B$ @ 1μ amps (ohms) | 397 | 283 | 258 | where $C_{CB}$ is collector to base capacitance, $C_{CS}$ is collector to substrate (isolation) capacitance, and $R_B$ is base resistance. The effect of the above improvements in device characteristics on a high speed circuit such as a loaded current switch emitter follower logic gate (fan in=3, fan out=3), is shown in FIG. 4 where the logic gate delay (in pico seconds) is plotted as a function of the logic gate power (in milli watts). Curves A1, A2 and A3 show the delays for the nominal, +3 σ and −3 σ cases for devices fabricated according to the prior art shown in FIG. 1 whereas curves B1, B2 and B3 show the corresponding delays for devices fabricated according to the present invention, as shown in FIG. 3.

The nominal delay corresponds to all power supplies held at their nominal values, all mask images in the silicon at their nominal image sizes, all process parameters (junction profiles, etc.) at their design values, and the circuit operating at 55° C. The three sigma (±3σ) limits A2, A3, B2 and B3 correspond to the power supply and temperature deviated to their operating limits and the process parameters deviated statistically to their three sigma limits.

As the curves clearly show, the structure of the present invention results in substantial improvement in the performance, especially in the 394 worst case to which computers and other electronic machines are designed.

For example, the worst case delay improves from 524 psec @7.0 milli watts for the prior art to 362 psec @4.7 milli watts for a similar logic gate using the present invention. The delay reduces to 303 psec if the power is held constant at 7.0 milli watts.

Figure 5A:
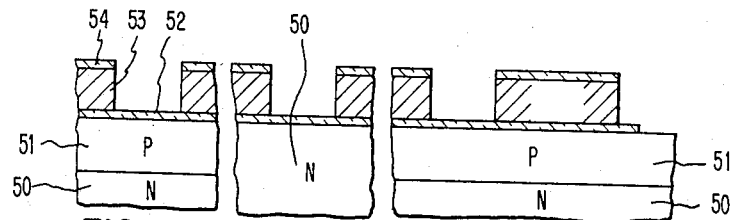
FIGS. 5A-5F illustrate one method embodiment for forming device structures of the present invention.
Figure 5B:
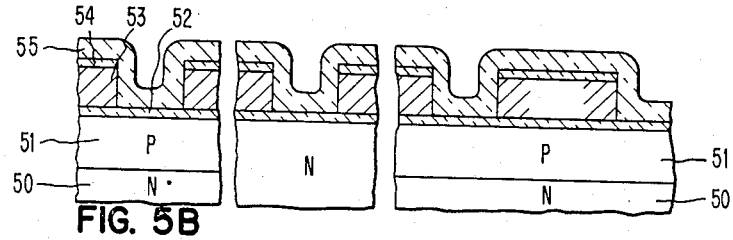
Figure 5C:
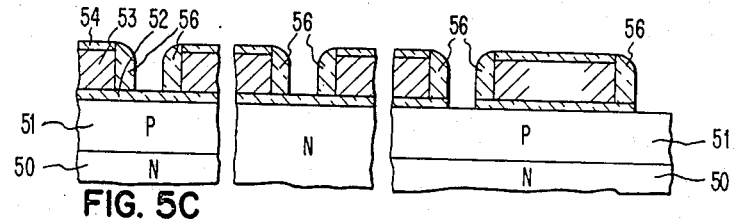
Figure 5D:
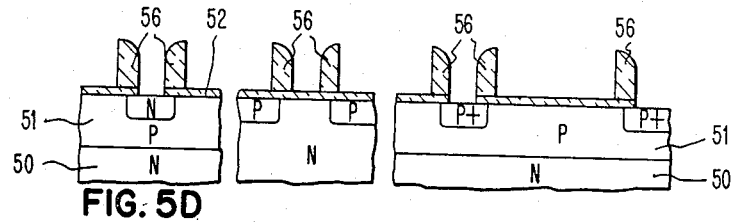

Refer now to FIGS. 5A–5F which illustrate a method for manufacturing structures according to one embodiment of the present invention. A silicon body 50 is provided. The body 50 is shown as N type in FIG. 5A wherein it can either be an N type epitaxial layer on a suitable monocrystalline silicon substrate or be an N type substrate itself. The structure has been broken into three parts to show the flexibility of the process for forming a variety of semiconductor devices having self-aligned metal to silicon contacts and sub-micron contact-to-contact and metal-to-metal spacing. A P region 51 may be formed according to diffusion, ion implantation or epitaxial growth techniques. A first insulating layer 52 is formed on a major surface of the body. This insulating layer can be any one of several conventional insulators or combinations of insulators such as silicon dioxide, silicon nitride, aluminum trioxide, etc. A polycrystalline silicon layer 53 is formed on the first insulating layer. The structure is placed in preferably a chemical vapor deposition ambient to form silicon nitride layer 54 on the surface of the polycrystalline silicon. Other layers such as chemical vapor deposited silicon dioxide, etc. can alternatively be formed upon the layer 53. Standard photolithography and etching techniques may be utilized to form openings in this silicon nitride layer 54 over the desired areas. Openings are formed in the polycrystalline layer 53 by reactive ion etching which results in a structure having substantially horizontal surfaces and substantially vertical sidewalls as shown in the FIG. 5A. The conditions of reactive ion etching for layer 53 require an etch ratio of about 10:1 silicon nitride layer 55 to polycrystalline silicon layer 53. FIG. 5B shows the result of the formation of a conformal layer 55 on both the substantially horizontal surfaces and the substantially vertical surfaces. The FIG. 5B structure is placed into a suitable reactive ion etching ambient for the material of layer 55. For example where the layer 55 is silicon dioxide, an etch ratio of about 10 to 1 silicon dioxide to silicon is desirable. Overetching is preferred to ensure that the silicon dioxide is removed. An etch stop indicator may also be used. The reactive ion etching process substantially removes the horizontal portion of layer 55 and provides the narrow dimensioned dielectric regions 56 on the vertical surfaces of the silicon body which is shown in the FIG. 5C. The layer 55 is typically formed by chemical vapor deposition. This conformal layer may be one of several insulating materials such as silicon dioxide, silicon nitride, aluminum oxide and combinations of these materials. Alternatively, the conformal layer can be polycrystalline silicon which can later have its surfaces formed into an insulating layer as will be described below. The FIG. 5C structure is then subjected to a polycrystalline silicon etchant, which is preferably ethylenediamine, pyrocatechol and water, to remove all polycrystalline silicon from the structure to produce the FIG. 5D device. Now the pattern of narrow dimensioned dielectric regions 56 is established on the integrated circuit structure. Doping to form, for example, the N region and P+ regions in FIG. 5D, is executed prior to the etching of the polycrystalline silicon to maintain the self-alignment feature. At this point diffusions or ion implantations may be accomplished by conventional techniques utilizing the patterns of narrow dimensioned dielectric regions as a mask therefor. Photolithography techniques may be utilized in conjunction with the narrowed dimensioned regions 56 to block off regions where it is not desired to change their conductivity. In this manner the PN junction in the left portion of the FIG. 5D has been formed together with the P+ regions on the right side of the FIG. 5D structure.

Figure 5E:
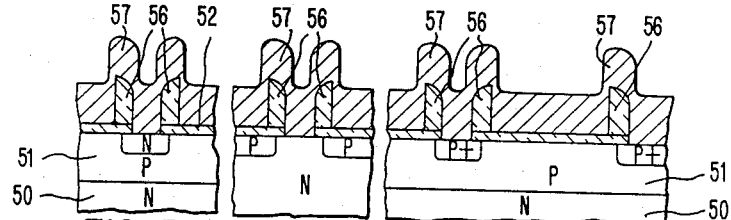
Figure 5F:
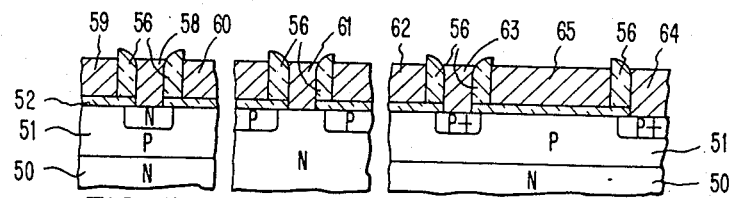

The formation of the metal contacts to the various devices can be understood with reference to the FIGS. 5E and 5F. A blanket deposition of a metal layer 57 forms the structure illustrated in FIG. 5E. The conductive layer 57 may be any layer which can be etched using reactive ion etch, plasma etch, or wet chemical etch while using the plastic layer as a mask. Typical materials are aluminum, aluminum-copper, chromium +aluminum-copper, etc. The layer is preferably deposited by evaporation and has a thickness of between about 0.8 to 1.5 micrometers. The precise thickness of the conductive layer is not critical, but the vertical dimension of the dielectric stud 56 and the thickness of layer 57 should be nominally equal to maintain planarity of the final structure. The structure is then planarized by applying a plastic, such as a photoresist or a polyimide material. The application of this film is typically by the spin-on technique commonly used for conventional photolithography process. A nominal film thickness for the plastic layer is equal to the stud height 57 plus about 20%. Formation of the plastic layer in this manner results in a layer thickness of <3000 Å over the stud and ≧1.2 micrometers over the lower regions of layer 57. The planarized structure is now placed in a reactive ion etching ambient. Etching is executed in an oxygen ambient to remove about 5000 Å of the plastic layer thus exposing the peaks of conductive layer 57 while retaining about 8000 Å of the plastic layer over the off-stud regions. Etching of layer 57 over the dielectric studs 56 may be accomplished using wet chemical etching, plasma etching or reactive ion etching. The retained regions of plastic layer are used to "mask" the underlying regions of conductive layer 57 during the removal of the conductive layer 57 over the dielectric studs 56. FIG. 5F shows a contact 58 to an N region within a P region. This contact 58 to the PN junction element is separated from metal lines 59 and 60 which are located on the first insulating layer 52. In the center section of the FIG. 5F there is shown a Schottky barrier diode anode contact 61 to the N type silicon body which contact is separated from another metal line 62. A P+ resistor is shown in the righthand side of FIG. 5F wherein contacts 63 and 64 are made to the P+ contact regions in the P region. Another metal line contact is shown at 65. The plastic layer is removed by oxygen ashing. The oxygen ashing of the plastic layer is accomplished in a commerically available barrel type plasma etch tool using an oxygen ambient and system power input of 300 to 400 watts.

Figure 6:
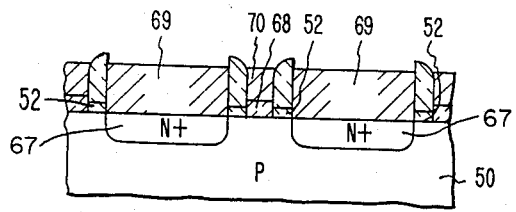
FIG. 6 schematically illustrates a field effect transistor embodiment of the present invention.

The structure of FIG. 6 may be formed according to the FIGS. 5A through 5F process wherein an N channel field effect transistor structure is the resulting device. The silicon body 50 in the case of making a field effect transistor is of a P type. No epitaxial layer is needed on the P type substrate under most circumstances. Dielectric isolation can be used to form isolated regions of monocrystalline silicon for field effect transistor devices to be formed therein. The FIG. 6 device does not illustrate such a pattern of dielectric isolation, which is typically utilized where highly dense integrated circuits are formed in the silicon body. The process continues as shown through FIG. 5D wherein N+ regions 67 are formed by either diffusion or ion implantation techniques to act as the source and drain of the devices. The doping of the N+ source and drain is preferably performed prior to sidewall fabrication. The first insulating layer 52 can either be chosen to be the thickness of the gate dielectric 68 or the gate dielectric 68 can be grown to the desired thickness of the gate region as shown in the FIG. 6 structure. The FIG. 5E and FIG. 5F process can be used to form the contacts 69 to the source and drain regions and forming the gate electrode 70. The gate dielectric can alternatively be formed of silicon dioxide or combinations of other materials such as silicon nitride, aluminum oxide and silicon dioxide.

Figure 7A:
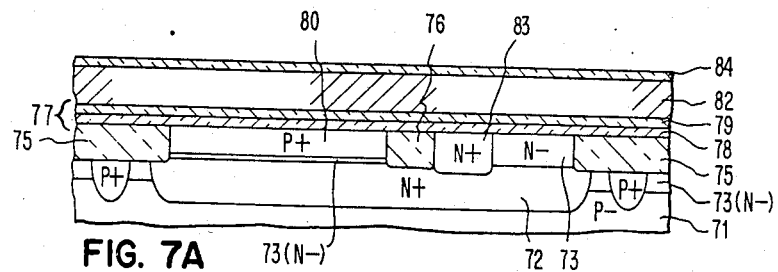
FIGS. 7A-7G illustrate another method embodiment for manufacturing device structures according to the present invention.

FIGS. 7A through 7G and 8 illustrate a further embodiment utilizing the self-aligned metal process to form bipolar integrated circuits. The process shown is used to form NPN bipolar transistors. However, it would be obvious that PNP transistors can alternatively be formed by simply reversing the polarities of the various elements of the transistors and associated regions. FIG. 7A illustrates one small, greatly enlarged portion of a silicon body which will be used to form a very dense bipolar integrated circuit. A P-substrate of monocrystalline silicon 71 has a subcollector N+ diffusion 72 formed therein. An epitaxial N layer 73 is then grown on top of the substrate. These process steps are well known in the formation of, NPN bipolar transistors. The substrate 71 is typically a <100> crystallographic orientation silicon wafer having a resistance of the order of 1 to 20 ohm-cm. The subcollector diffusion 72 is typically formed using arsenic having a surface concentration of about $10^{20}$ atoms/cm$^3$. The epitaxial growth process to form layer 73 may be by conventional techniques, such as the use of SiCl$_4$/H$_2$ or SiH$_4$/H$_2$ mixtures at temperatures about 1000° C. to 1200° C. During the eptaxial growth, the dopant in the N+ layer moves into the epitaxial layer. The thickness of the epitaxial layer for highly dense integrated circuits is on the order of 3 micrometers or less. P+ channel stop regions can also be formed in the substrate 71 in the designated areas under which the recessed silicon dioxide isolating regions are to be formed. These P+ regions prevent surface inversion and current leakage. A mask, such as a thermally grown silicon dioxide layer (not shown) is formed on the surface of the epitaxial layer 73 and by suitable photolithographic and etching techniques mask openings are formed therein.

The next series of steps involves the formation of isolation means for isolating regions of monocrystalline silicon from other regions of monocrystalline silicon. The isolation may be by back-biasing PN junctions, partial dielectric isolation or complete dielectric isolation. The dielectric materials used may be silicon dioxide, glass, etc. The preferred isolation for highly dense integrated circuits is dielectric isolation. The FIG. 7A shows partial dielectric isolation with dielectric regions 75 isolating monocrystalline silicon regions of the silicon body from one another and a region 76 which isolates the base emitter region from the collector reachthrough region. There are many methods known in the art to form dielectric regions of this type. It is preferred to use the process described in the Magdo, et al patent application, Ser. No. 150,609, filed June 7, 1971, or Peltzer U.S. Pat. No. 3,648,125. Alternatively, the process described in J. A. Bondur et al U.S. Pat. No. 4,104,086 can be used. In the patent application and patents the processes for forming partial dielectric isolation for regions 75 and 76 are described in detail.

The N+ collector reach-through 83 to subcollector region 72 is formed using standard lithography, etching and diffusion or ion implantation techniques. Region 83 is typically formed with a phosphorus dopant.

The P+ base region 80 is formed at this time using silicon dioxide masking with standard lithography, etching and diffusion or ion implantation techniques. It is preferred that the base region abut the dielectric isolations, as shown in the drawing. The masking and lithography layers are then removed. A first insulating layer 77 which may be a composite layer of thermally grown silicon dioxide 78 and chemical vapor deposited silicon nitride 79 is formed on the surface of the silicon body. This insulating layer may be alternatively one or a combination of known insulating materials such as silicon dioxide, silicon nitride, aluminum trioxide, or the like, in addition to thermally grown silicon dioxide. The silicon dioxide layer 78 may be thermally grown in an oxygen or oxygen-water vapor ambient at a temperature of about 925° C. A second method for growing silicon dioxide involves the use of a chemical vapor deposition process wherein $SiH_4$, $O_2$ at about 450° C.; or $SiH_2Cl_2$, $N_2O$ at a temperature of about 800° C. under atmospheric or low pressure conditions. The deposition of silicon nitride is usually formed by chemical vapor deposition using the following process conditions: $SiH_4$, $NH_3$ and $N_2$ carrier gas at a temperature of about 800° C. under atmospheric or low pressure conditions as discussed in the V. Y. Doo U.S. Pat. No. 4,089,992.

A coating 82 of polycrystalline silicon is now deposited over the entire wafer by using, for example, silane in a hydrogen ambient in a temperature range of 500° to 1000° C. The operative thickness of the polycrystalline silicon is between 8,000 to 15,000 Angstroms with 12,000 Angstroms preferred. Should the thickness be greater than about 15,000 Angstroms, planarity problems arise and make it difficult to fabricate high circuit density chips. If the thickness is less than about 5,000 Angstroms, selective removal of the conductive layer from the top of the dielectric studs becomes difficult to control without removing the conductive layer from the off-stud regions. The polycrystalline silicon makes no electrical contact to the silicon body since it is formed upon the first insulating layer 77.

The structure is placed in chemical vapor deposition ambient to form the second insulating layer such as silicon nitride layer 84 on the surface of the polycrystalline silicon. Standard photolithography and etching techniques may be utilized to form openings in this silicon nitride layer 84 over the areas which are designated to be the emitter areas and the collector reach-through areas. Alternatively, other materials such as chemical vapor deposited silicon dioxide, silicon nitride or combinations of these materials can be used in place of the thermally grown silicon dioxide layer. The thickness of the second insulating layer mask is typically 500 to 2,000 Angstroms. The structure is placed in a reactive ion or plasma etching environment for polycrystalline silicon having typically the conditions as follows: for example, $Cl_2$-Argon or $CCl_4$-Argon, RF parallel plate structure about 10 microns pressure, 0.16 watts/cm$^2$ power density and 10 cc/minute flow rate and using the apparatus described in Harvilchuck, et al patent application, Ser. No. 960,322, filed Nov. 13, 1978, which is a continuation of Ser. No. 822,775, filed Aug. 8, 1977, now abandoned, which is a continuation of Ser. No. 594,413, filed July 9, 1975, now abandoned. The reactive ion etching process is completed when the dielectric layer 79 is reached. The etch rate ratio of polycrystalline $SiO_2$(or $Si_3N_4$)≧10:1 for the polycrystalline silicon reactive ion etching.

Figure 7B:
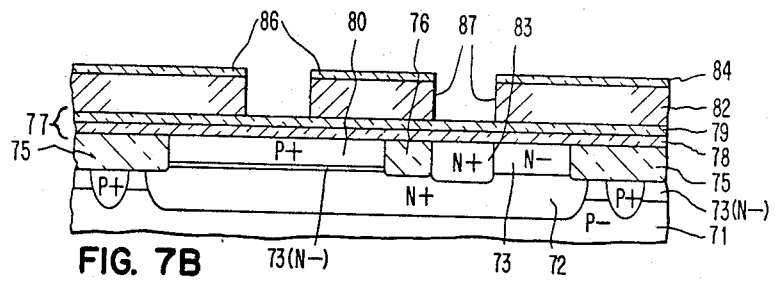

The resulting structure is shown in FIG. 7B wherein the emitter window and the collector reach-through window have horizontal surfaces 86 and vertical surfaces 87. A conformal layer 88 is deposited on both the substantially horizontal surfaces 86 and the substantially vertical surfaces 87. This layer 88 is typically formed by chemical vapor deposition. This conformal layer must be as formed on an electrical insulator or capable of being changed to an insulator and may be one of several insulating materials, such as silicon dioxide, silicon nitride, aluminum oxide, polycrystalline silicon and combinations of these materials. For this example a layer of silicon dioxide for conventional chemical vapor deposition is used.

Figure 7C:
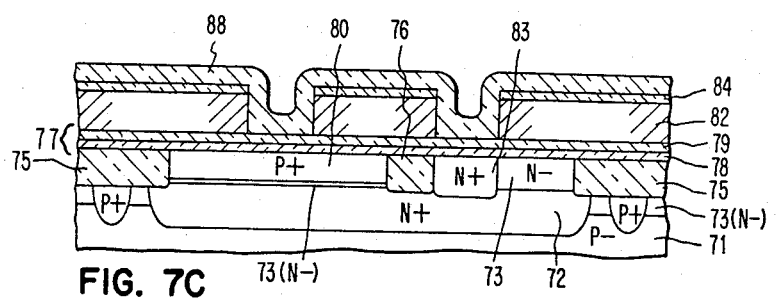
Figure 7D:
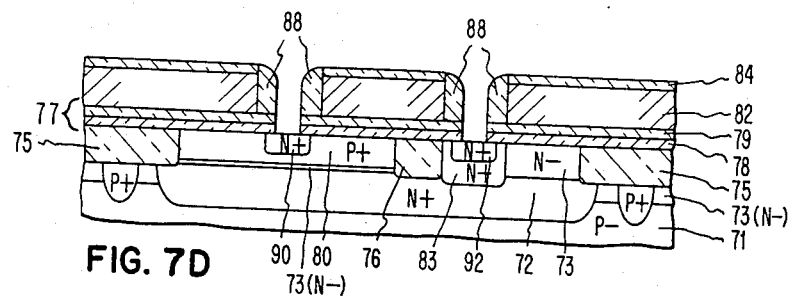

FIG. 7C shows the result of this step. The thickness of the conformal layer 88 is chosen for device design purposes such as the metal-to-metal conductor separation. The thickness of the conformal layer is between about 3,000 to 12,000 Angstroms and is preferably about 7,000 Angstroms. The thickness may depend upon the particular layer used. For example, where polycrystalline silicon is used and its surface is subsequently oxidized, a thinner polycrystalline silicon layer is preferred than when an insulator conformal coating is originally deposited. Where the thickness is greater than 15,000 Angstroms, longer etching times are required. Where the thickness is less than 5,000 Angstroms the capacitance between adjacent metal lines becomes large. The FIG. 7C structure is placed into a suitable reactive ion etching ambient to etch the material of layer 88. For example, in etching silicon dioxide, the conditions are such that an etch ratio of about 10/1 ($SiO_2$)/(Si) is desirable. Overetching is needed to be sure $SiO_2$ is removed and/or etch stop indicator may be used. The reactive ion etching process substantially removes the horizontal portion of layer 88 and provides the pattern of narrow dimensioned vertical regions on the silicon body which is shown in FIG. 7D.

The next step is to provide the emitter 90 and collector reach-through 92 regions. Where it is desired to form the N+ emitter region 90 and collector reach-through region 92 by means of thermal diffusion, the reactive ion etching of layer 88 is continued all the way down to the bare silicon surface. A thermal diffusion process for a N type impurity, such as arsenic or phosphorus, under the usual conditions for making emitter diffusions and depending on the desired emitter depth and, for example, an arsenic capsule diffusion at 1000° C. may be utilized. Where it is desired to ion implant impurities into the body to form the emitter region 90 and collector reach-through region 92, it is preferable to implant these impurities through a thin insulating screen layer (not shown). The formation of this screen is accomplished simply by allowing the reactive ion etching to remove the insulator from the horizontal surfaces, except for a thin screen layer (not shown). Alternatively, the insulator is completely removed and a thin silicon dioxide is grown to form the screen. The structure is then placed in ion implantation apparatus wherein desired impurities such as arsenic, phosphorus, or the like, pass through the screen layer (not shown) to form the diffused regions 90 and 92. The conditions of such an ion implantation process are a $9.5 \times 10^{15}$ atoms/cm$^2$ dose of arsenic at 50 KeV. A drive-in step is carried out at a temperature of about 1000° C. in inert gas followed by exposure of an oxidizing atmosphere.

Figure 7E:
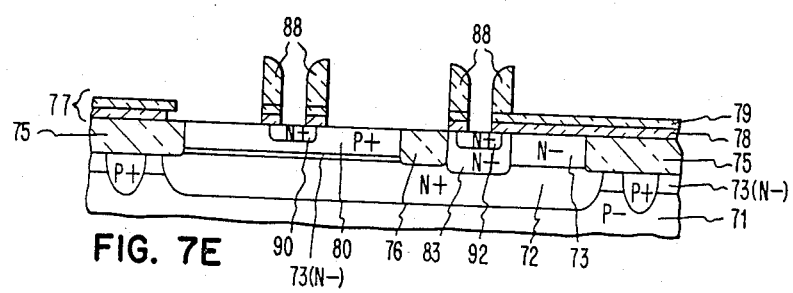
Figure 7F:
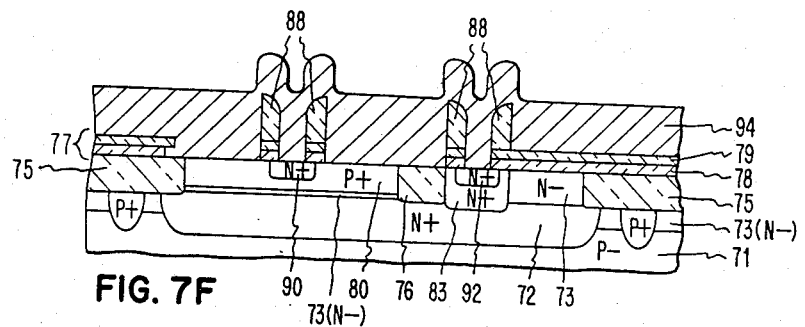
Figure 8:
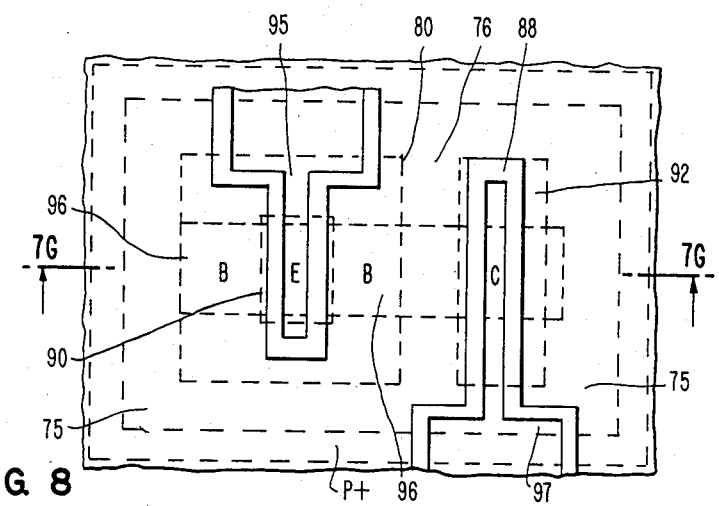
FIG. 8 illustrates the resulting top view of the process of FIGS. 7A-7G.

Referring now to FIGS. 7E, F, and G and FIG. 8, H$_3$PO$_4$ etch of Si$_3$N$_4$ layer 4 is required followed by the removal of the remaining polycrystalline silicon layer 88 by pyrocatechol etching solution to produce the FIG. 7E structure. Layer 77 is wet etched, reactive ion etched or plasma etched to open the contacts to the device to produce the FIG. 7E structure. A blanket coating of metal 94 is deposited over the pattern of narrow dimensioned dielectric regions to provide electrical contact to regions 80, 90 and 92 formed in substrate 71 as shown in FIG. 7F. The preferred metal layer is formed of chromium and aluminum-copper by evaporation or sputtering. The surface of the FIG. 7F structure is planarized by a blanket deposition of a plastic material over the metal layer. This plastic material can be photoresist or a polyimide material, or the like. The plastic material is deposited using the spin-on technique as is common practice for photolithography resist or polyimide application processes. Commercially available 1.0-2.0 micrometer grade photoresist is typically used, and is applied at a spin speed of 3000-4000 rpm yielding a nominal film thickness of 1.3 to 1.5 micrometers. The plastic layer thickness over the dielectric stud is typically 1000-3000 Å.

The planarized structure is placed in a reactive ion etching ambient. Etching is performed in an oxygen ambient for all plastic layers removing 3000-5000 Å. The conductive layer is exposed over the dielectric studs, but is not attacked by the oxygen etch. Subsequently the metal over the dielectric studs is removed by conventional wet chemical etch, plasma etch, or reactive ion etching. During this etch the retained plastic layer serves to mask the off-stud regions of the conductive layer. Alternatively, the reactive ion etching may uniformly etch the plastic and the metal layer until the tops of the narrow dimensioned dielectric regions are reached. The remaining plastic material is removed by, for example, oxygen ashing, or other suitable processes. Ashing of photoresist is accomplished in an oxygen ambient using a commerically available barrel type plasma etch tool operated at 300-400 watts for 30-60 minutes.

Figure 7G:
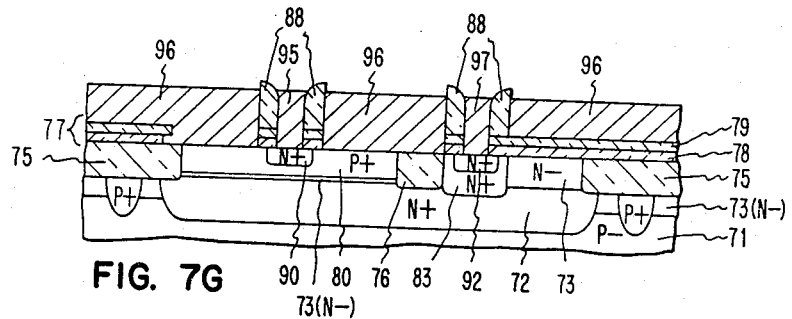

The result of the process is the substantially planar structure of FIG. 7G wherein the emitter contact is 95, the base contact is 96 and the collector contact is 97. FIG. 8 shows the top view of the structure. The cross-sectional view of FIG. 7G is taken along line 7G—7G in FIG. 8.

The resulting self-aligned metal structure places the metal over the base contact to within about 3500 Å from the edge of the emitter, thereby essentially eliminating the extrinsic base resistance of the device. Reduction of the base resistance is one of the primary means to achieve enhanced bipolar device performance. The reduction of base resistance achieved with this technique is superior as compared to prior art structures which use doped polycrystalline silicon, or metal silicides of polycrystalline silicon to reduce the extrinsic base resistance.

The FIG. 8 layout shows how the metal 95 over the N+ emitter region can be isolated from the metal 96 over the P base region with submicron metal-to-metal spacing.

Figure 9A:
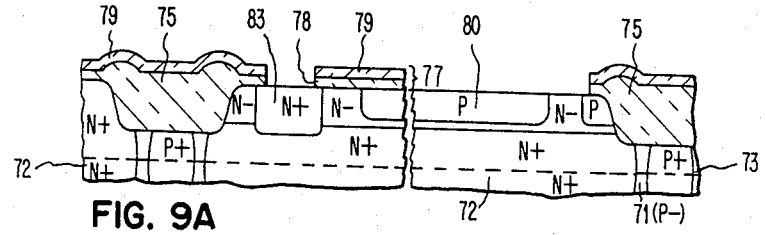
FIGS. 9A-9H illustrate another method embodiment and resulting structure for forming products according to the present invention.

FIGS. 9A through 9H illustrate another embodiment of a method for forming self-aligned metal integrated circuit structures. FIG. 9A is a greatly enlarged portion of such an integrated circuit at an intermediate stage of its manufacture. The particular integrated circuit structure being manufactured includes NPN bipolar transistors and Schottky barrier diodes. The FIG. 9A structure has been manufactured in a similar manner as the structure shown in FIG. 7A above with certain exceptions. The major exception is the use of recessed oxide isolation, which may be formed according to the process described in the I. Magdo, et al patent application Ser.No. 150,609, filed June 7, 1971, and Peltzer U.S. Pat. No. 3,648,125. This process produces the characteristic "bird's head" and "bird's beak" structures which are shown in the FIG. 9A structure. The second major difference is that an opening is provided in the first insulating coating for a Schottky barrier diode, as well as for the emitter, base, and collector reach-through contacts. Further, it is seen that the emitter and base contact openings are replaced by a single opening. A third difference is that the FIG. 9A structure does not use recessed oxide isolation between the base region and the collector reach-through region. Where similar elements are shown, the same reference numbers are used in FIGS. 7A and 9A.

The FIG. 9A structure is subjected to a thermal oxidation ambient such as oxygen and/or steam at a temperature of 925° C. to regrow portions of the first insulator layer over the contact openings shown in FIG. 9A. The resulting silicon dioxide coating is layer 100. A first layer 102 of polycrystalline silicon is now formed on the insulating layers 79 and 100. As described with respect to FIGS. 7A-7G, the first insulating layer 77 may be a composite formed of a silicon dioxide layer 78 and a silicon nitride layer 79. The preferred method for forming the polycrystalline silicon layer 102 together with its preferred thicknesses is identical to that described in regard to the FIG. 7 process. The structure is put into a reactive ion etching ambient as described above with respect to FIG. 7B to form the substantially vertical and substantially horizontal surfaces. The openings are made in the first polycrystalline silicon layer 102 to the regions designated as above the emitter and collector reach-through. The Schottky barrier diode designated region remains covered with the polycrystalline silicon layer, as shown on the left side of FIG. 9B. Silicon nitride layer 103 was utilized as the etch mask for the first layer of polycrystalline silicon. The structure is then subjected to a conventional thermal oxidation to form silicon dioxide layer 104 on all unmasked surfaces of the polycrystalline layer 102. A silicon nitride layer 105 is chemically vapor deposited by the conventional techniques as described above on top of the silicon dioxide layer 104. A second polycrystalline silicon conformal layer 106 is deposited over the silicon dioxide and silicon nitride layers 104 and 105. The result of this series of process steps is FIG. 9C.

Figure 9B:
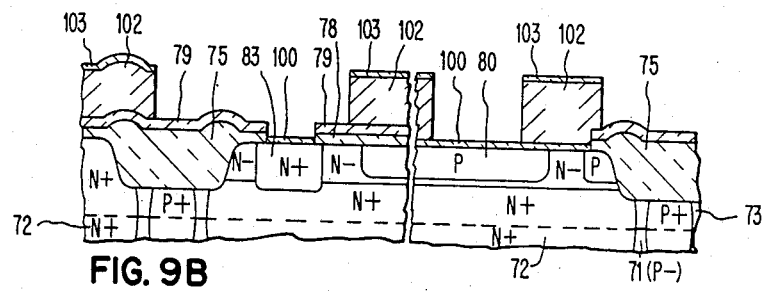
Figure 9C:
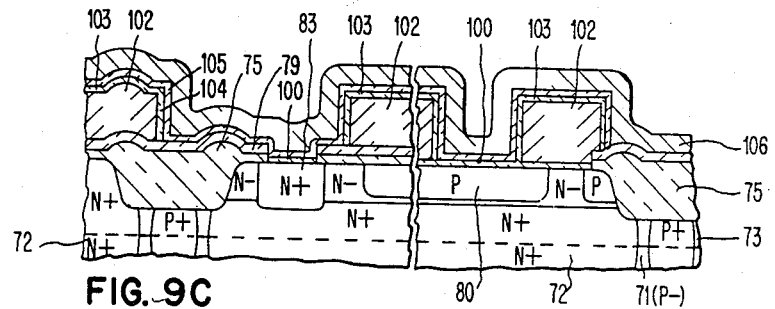
Figure 9D:
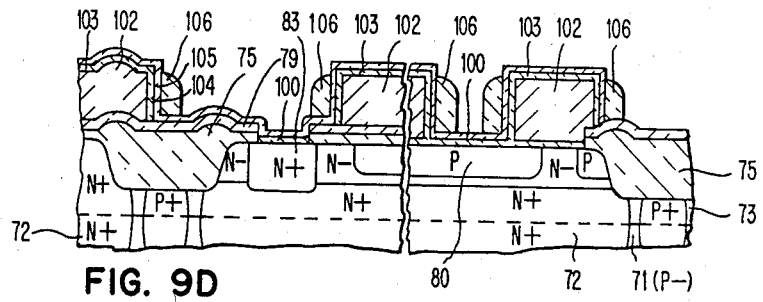
Figure 9E:
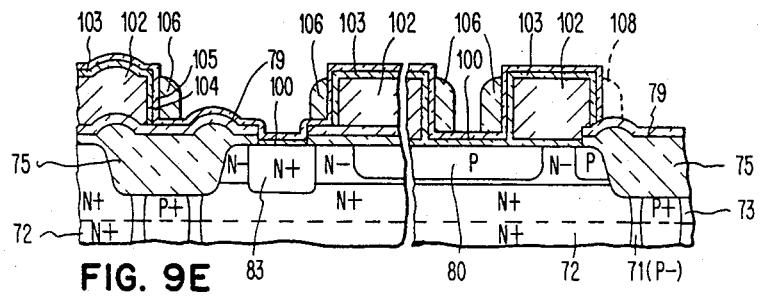
Figure 9F:
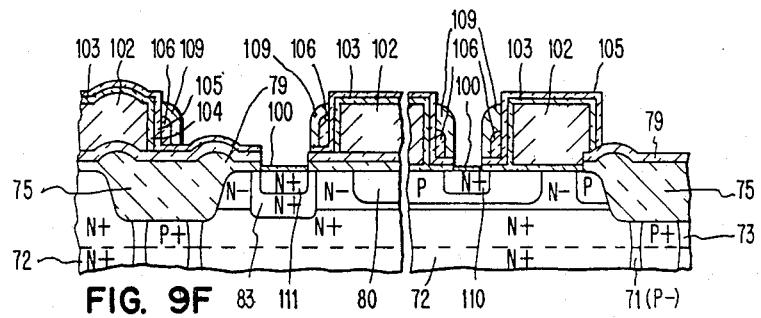
Figure 9G:
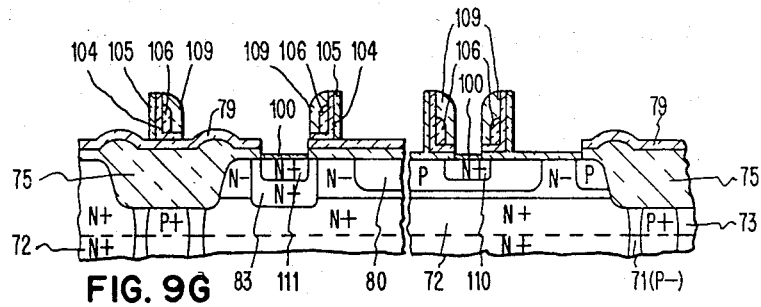

The pattern of narrow dimensioned dielectric regions is now formed by the steps illustrated in FIGS. 9D-9G. The FIG. 9C structure is placed in a reactive ion etching ambient which is the same as the process for etching layer 102. A typical etch process is performed in an R.F. parallel plate reactor using SF$_6$+Cl$_2$ in a He carrier at a system pressure of 70-120 microns of Hg and an input power density of 0.14 to 0.18 watts/cm$^2$. The flow range is 20–50 cc/min of 2.5 SF$_6$:7.5 Cl$_2$:90.0 He in parts by volume. The etch rate ratios of polycrystalline silicon Si$_3$N$_4$ are $\geq$ 10:1. The resulting structure is given in FIG. 9D wherein the polycrystalline silicon regions on the vertical surfaces remain while all horizontal regions of the layer 106 have been removed by the reactive ion etching process. Should it be necessary, photolithography and etching techniques can be utilized to remove portions of the pattern of polycrystalline silicon narrow dimensioned regions. This is illustrated at 108 wherein a portion of the polycrystalline silicon pattern has been removed, as shown in FIG. 9E. The polycrystalline silicon layer pattern 106 is now subjected to thermal oxidation ambient conditions at the conventional temperature to oxidize the surface of the polycrystalline silicon layer 106 to a silicon dioxide layer 109. The oxidation to silicon dioxide need not consume the whole polycrystalline region as is illustrated in the FIG. 9F structure. The silicon dioxide layer 100, which covers the contact regions, is removed by a conventional silicon dioxide etch, such as reactive ion etch using CF$_4$ or a conventional wet chemical etch when it is desired to thermally diffuse the N+ region 111. Either a thermal diffusion is made using arsenic or phosphorus dopant to form the N+ emitter and collector reach-through regions 110 and 111, respectively, or the screen oxidation is accomplished plus an ion implantation step using arsenic or phosphorus ions plus a conventional annealing cycle to fully form or activate the emitter and collector reach-through regions 110 and 111. After either the diffusion or ion implantation, it is desirable to form a thin layer of about 300–400 Å of silicon dioxide on the N+ regions 110 and 111. This completes the steps to form the FIG. 9F. The silicon nitride layer 105 is removed by etching with a hot H$_3$PO$_4$ etchant or RIE using CF$_4$, or the like. A pyrocatechol etchant is now utilized to completely remove the remaining first layer of polycrystalline silicon 102. At this point, only the pattern of narrow dimensioned dielectric regions remains on the major surface of the silicon body. These regions are composed of a composite of silicon dioxide, silicon nitride, and an inner core of the remaining second layer of polycrystalline silicon. The dimensions of these regions are typically in the range of 0.5 to 1.2 microns in width and 0.8 to 1.5 microns in height. The silicon dioxide layers present over the various contact openings, such as the emitter base, collector reach-through, Schottky diode region and diffused resistor regions (not shown) are removed by a conventional dip etching process utilizing a hydrofluoric acid etchant.

Figure 9H:
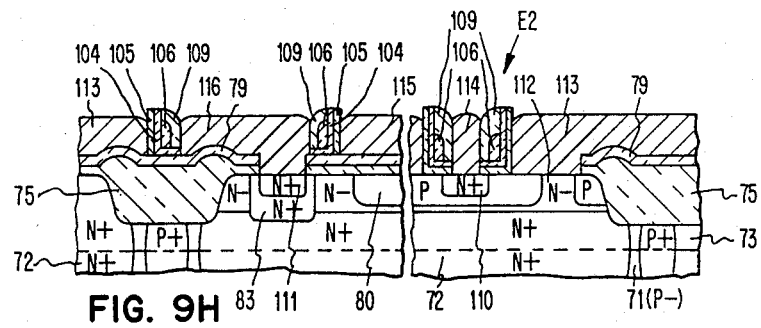

A contact metal, such as palladium, platinum, titanium, or the like, is deposited, sintered and etched under the following conditions. If PtSi contact metallurgy is used, the unreacted platinum is removed in aqua regia after sintering. Similarly, if other silicides are used, other suitable etchants are employed. The contact metal may be sputtered or evaporated to a thickness of 500–1000 Å. The resulting contact is a thin metal silicide structure on the surface of each of these regions (not shown). A blanket deposition of a metal such as aluminum, aluminum-copper or chromium and aluminum-copper is formed over the major surface which contains openings to the elements of the silicon body, first isolating layer 77 and the pattern of dielectric regions. The result of this deposition is a rather non-planar surface. The surface is planarized by depositing a plastic material as described in regard to the FIG. 7F and 7G process. The plastic material is removed such as described in regard to the FIG. 7 process typically by oxygen reactive ion etching. The resulting structure is shown in FIG. 9H. The contacts to the electrical devices are self-aligned to the narrow dimensioned regions, and the structure is substantially planar. The structure shown in FIG. 9H includes contacts to a Schottky barrier diode region 112 wherein the Schottky anode contact is 113, and an NPN transistor having emitter contacts 114, base contacts 115 and collector reach-through contacts 116.

Figure 10:
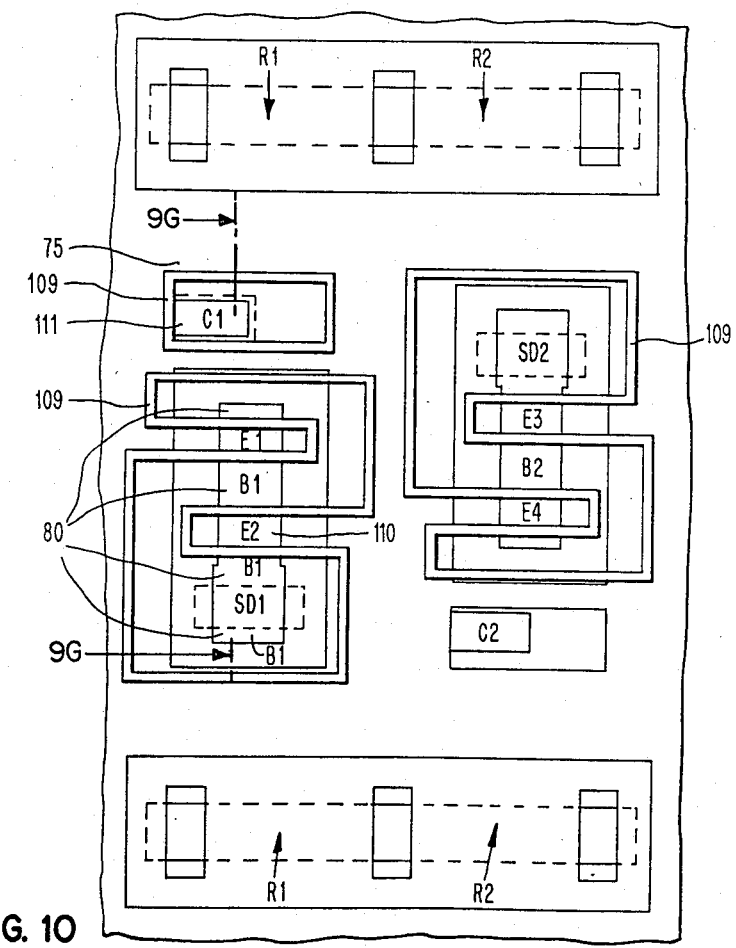
FIGS. 10 and 11 show a memory cell horizontal layout at two different stages of manufacture for the FIG. 12 memory cell made according to the present invention.
Figure 11:
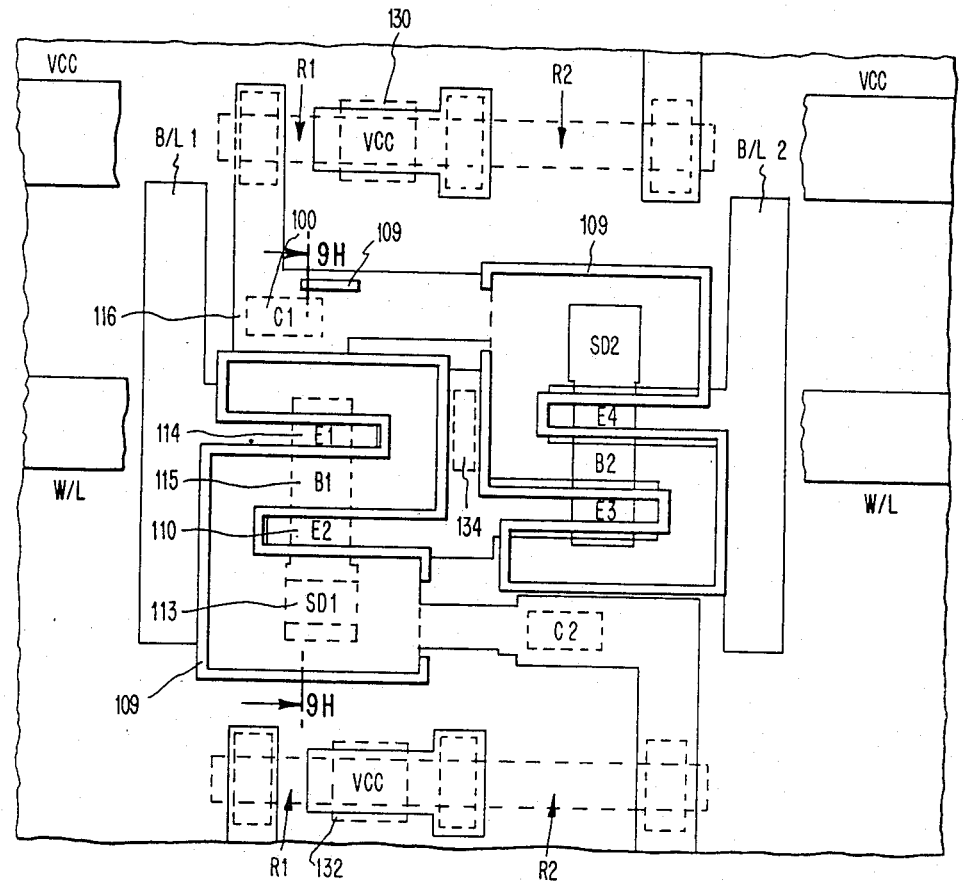
Figure 12:
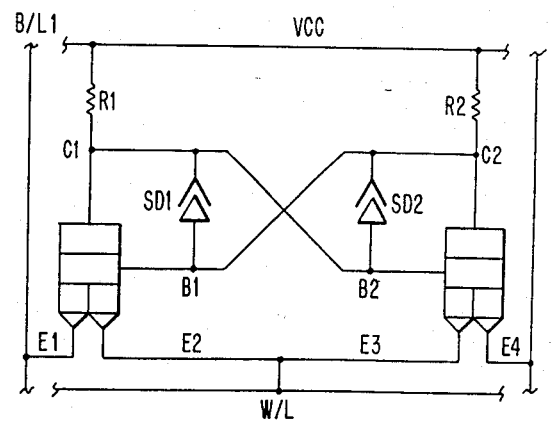

The FIGS. 10, 11, and 12 illustrate the design of a double emitter memory cell layout and circuit with integrated Schottky barrier diodes and P diffused resistors. The layout of FIG. 10 and 11 utilizes the process described in FIG. 9A through 9H to manufacture. The like numbers indicate like elements in FIGS. 9G and 9H, 10, 11, and 12.

FIG. 10 shows the recessed oxide isolation 75, base region 80, E2 emitter region 110, N+ collector reach-through contact 111, ion implanted resistors R1 and R2, and pattern of narrow dimensioned regions 109. Note that emitter E1 was not shown in the cross-sectional drawings 9G or 9H. It is identical to E2 which is shown.

FIG. 11 shows the pattern of studs 109 after selective removal of portions of the pattern by etching techniques; NPN contacts for emitter 114, base 115 and resistors R1, R2, collector 116; and Schottky diode anode contact 113. The second level metal runs horizontally and is used to supply positive bias (VCC) to the resistors through vias 130 and 132. The second level metal also connects the two emitters to the word line, W/L, through via 134, as shown in FIG. 11. Bit lines B/L1, B/L2 and cell interconnections are formed by the first level metal. A lift-off process is used to define both the first and second level metal patterns. The lift-off process may be better understood by reference to J. R. Franco, et al, U.S. Pat. No. 4,004,044 which is one example of such a process. FIG. 12 shows the electrical equivalent circuit of the cell shown in FIG. 11.

Figure 13A:
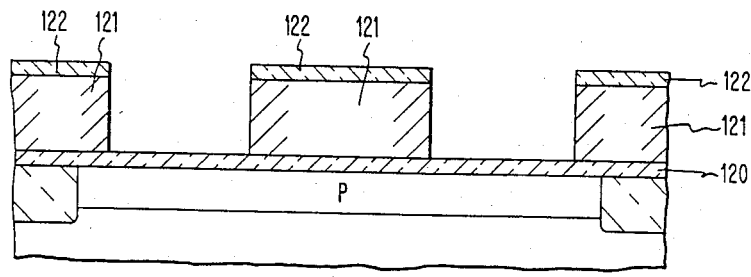
FIGS. 13A-13D show a process for making an even smaller bipolar transistor utilizing another method embodiment of the present invention.
Figure 13B:
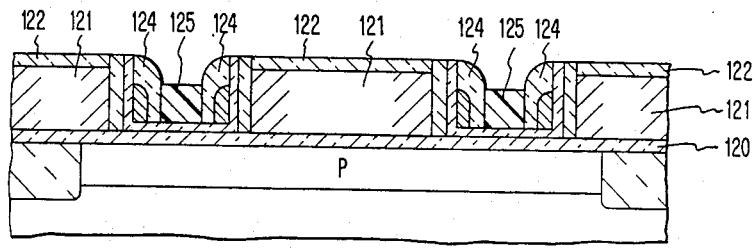
Figure 13C:
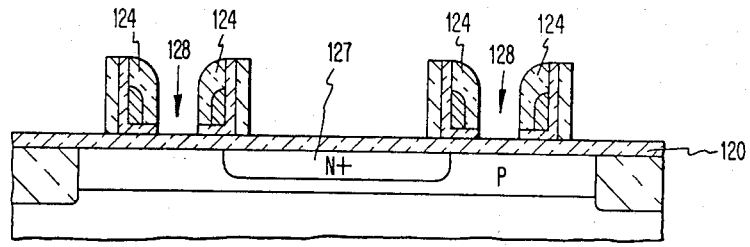
Figure 13D:
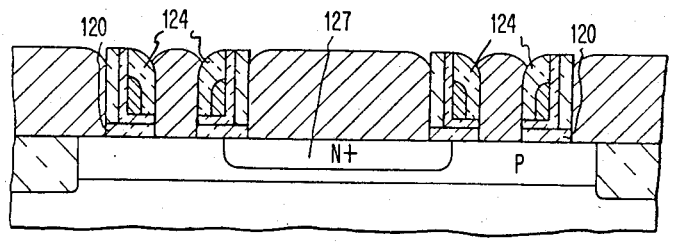

There are many variations to the processes described above. One of the most critical problems in high density integrated circuits is the emitter structure. The FIGS. 13A–13D illustrate an improved method for forming the emitter for the self-aligned metal process. The emitter size is determined by current density considerations. Using a ground rule of a minimum line width of 2.5 microns, a 2.5 emitter width line is assumed which results in the device size using a self-aligned metal structure of the present invention of 0.9 microns. To overcome this narrowed emitter problem, the base contact can be reduced since the current density is negligible for the base contact. This is achieved if the emitter narrow dimensioned dielectric region or sidewall is determined from the "outside", rather than "inside", as shown in the above described process. The base contact windows can be reduced without change in device characteristics, and a 20 percent density improvement is achieved. The process is modified as follows to produce this advantageous density improvement. After the base diffusion and reoxidation, the base silicon dioxide is removed by etching and reoxidized to about a 250 Angstrom layer of silicon dioxide 120. A first layer of polycrystalline silicon 121 is deposited thereover. A layer 122 of silicon nitride is then formed on the surface of the polycrystalline silicon layer 121. The contact openings are then defined by photolithography and etching techniques in the silicon nitride layer 122, and the polycrystalline layer 121 is reactive ion etched to the silicon dioxide layer 120 to form the substantially horizontal and substantially vertical regions on the major surface of the silicon body. The process now continues either in using the silicon dioxide insulator, or the like, conformal layer as described in the FIG. 7A through 7F embodiment or the composite pattern of narrow dimensioned dielectric regions of silicon dioxide, silicon nitride and polycrystalline silicon as described in the FIG. 9A through 9H embodiment. For illustrative purposes, the FIG. 9A through 9H embodiment is shown to have been formed resulting in the FIG. 13B structure wherein the pattern of narrow dimensioned dielectric composite regions are indicated as number 124. A plastic material, such as photoresist or polyimide 125 is spun onto the surface by conventional techniques to produce an approximately 1.2 microns thick coating over the entire major surface. A reactive ion etching step is utilized to expose the top surface of the silicon nitride layer 122 over the polycrystalline silicon layer 121. The silicon nitride layer 122, shown in FIG. 13B, is then reactive ion etched to competely remove it. The polyimide or photoresist layer 125 is then removed by oxygen ashing. The polycrystalline silicon layer 121 is removed in a pyrocatechol solution, or the like. The emitter 127 is implanted through the thin silicon dioxide layer 120. This is possible because the pyrocatechol does not attack the silicon dioxide material in any siniicant way. This emitter ion implant in the base contact regions 128 or any Schottky barrier diode regions (not shown) are masked by the thermal silicon dioxide layer 120 and silicon nitride. After the emitter annealing step at a temperature of 900° C.–1000° C., any undesired silicon nitride is removed in hot $H_3PO_4$, and the emitter silicon dioxide layer 120 is removed by reactive ion etching. The base and any Schottky barrier diode silicon dioxide layer 120 which remains can be dip etched to complete that portion of the process. The self-aligned metal structure of FIG. 13D can be completed by the deposition of the blanket metal and the reactive ion etching techniques described in relation to FIG. 7A through 7F and FIGS. 9A through 9H. As can be seen from the FIG. 13D, the NPN transistor device size is reduced without changing the emitter size to less than the minimum width in the chosen ground rule. The process also has the advantage of protecting the designated emitter regions during the process which eliminates the need of any possible etching into the emitter regions.

Figure 14A:
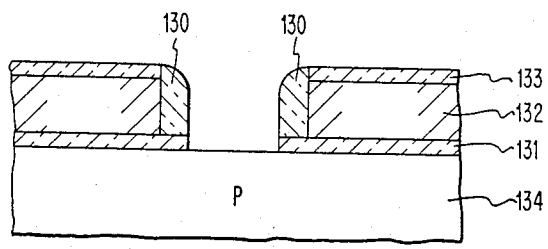
FIGS. 14A-14D illustrate the formation method of a self-aligned polysilicon emitter contact embodiment as part of the present invention.
Figure 14B:
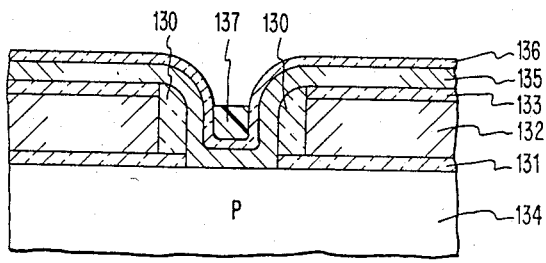
Figure 14C:
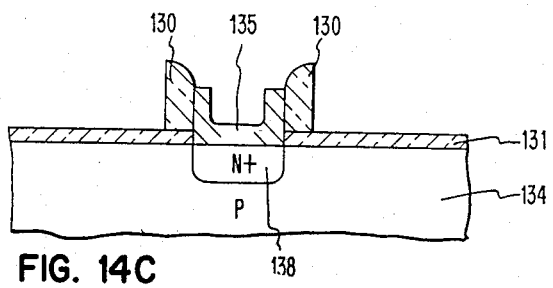
Figure 14D:
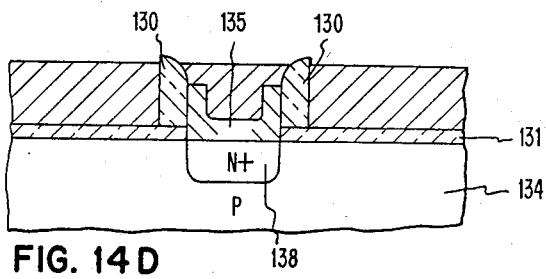

Another embodiment to form an improved emitter structure using the self-aligned metal process is shown in FIGS. 14A, 14B and 14C. The resulting structure from this process produces a self-alignment of polycrystalline silicon contacts to the monocrystalline silicon emitter contact holes. The process is identical to those shown in FIGS. 7A through 7F and FIGS. 9A through 9H through the pattern of narrow dimensioned dielectric regions or sidewall structures 130. The first insulating layer 131 has a first polycrystalline silicon layer 132 formed thereover, and a silicon nitride layer 133 deposited onto the polycrystalline silicon layer. Only that portion of the integrated circuit structure which includes the P type base region 134 is shown for simplicity in the FIGS. 14A through 14C. The emitter contact openings are dip etched open to form the FIG. 14A structure. A second layer 135 of polycrystalline silicon of a narrow thickness which might be, for example, about 500 Angstroms is formed as shown in the FIG. 14B. An emitter screen silicon layer 136 of about 250 Angstroms is formed over the polycrystalline silicon layer 135 by thermal oxidation. The desired dopant, either N or P, is then ion implanted through the screen silicon dioxide layer 136 into the polycrystalline silicon layer 135. Typical implant conditions for an arsenic emitter are a dosage of $1.0 \times 10^{16}$ ions/cm$^2$ implanted at an energy of 50 KeV or for shallower devices 70 KeV, $5.0 \times 10^{15}$ ions/cm of $^{75}$As+. A planarizing film of about 0.8 to 1.2 microns of a suitable plastic, such as a photoresist material, polyimide, etc. is deposited by the conventional spin-on process. The structure is then put into a reactive ion etching ambient to remove the plastic layer 137 down to the silicon dioxide layer 136 except in indentations, as shown in FIG. 14B. Reactive ion etching is typically performed in an oxygen ambient using a parallel plate apparatus. The FIG. 14B structure is subjected to a reactive ion etching ambient of carbon tetrafluoride ($CF_4$) to remove the emitter screen silicon dioxide layer 136, the polycrystalline silicon layer 135 and the silicon nitride layer 133. Only the layers 135 and 136 underneath the remaining plastic layer 137 remains on the structure after this step. The plastic resist material 137 is removed by a suitable oxygen ashing process as described above and a hot acid cleaning step is provided. The structure is annealed to form the N+ emitter 138 by an outdiffusion from the self-aligned polycrystalline silicon emitter contact 135. The first layer of polycrystalline silicon 132 is removed by pyrocatechol etchant, and the remaining silicon dioxide layer 136 is removed by a suitable conventional, etchant such as buffered hydrofluoric acid, or by a reactive ion etchant. The self-aligned metal layer is then formed as described with respect to FIGS. 7F and 9H to form the self-aligned metal contacts to the base region, the polycrystalline silicon emitter contact 135, the collector reachthrough contact (not shown) and any other contacts on the highly dense integrated circuit structure.

The following example is included to aid in the understanding of the invention. Variations may be made by one skilled in the art without departing from the spirit and scope of the invention.

EXAMPLE

The self-aligned metal high density integrated circuit structure was formed on a silicon body 140, as shown in FIG. 15A. A first insulating layer 142 of 400 Angstroms was formed by thermal oxidation on the silicon body 140. A first polycrystalline silicon layer 144 of 10,400 Angstroms was deposited by low pressure chemical vapor deposition. A 1,600 Angstrom layer (not shown) of silicon nitride was deposited by chemical vapor deposition process under the conditions of 1000° C. in an ambient of $NH_3 + Si_3H_4$. The photoresist layer was removed by oxygen ashing. Using the silicon nitride layer as a mask, the polycrystalline silicon layer 144 was subjected to a reactive ion etching ambient of sulfur hexafluoride and chlorine ($SF_6 + Cl_2$) under the conditions of 0.14–0.18 watts/cm$^2$ and about 50–100 microns of Hg pressure in a parallel plate R.F. reactor. The first layer of polycrystalline silicon 144 was thereby etched to form substantially horizontal and substantially vertical surfaces on the body. The structure was placed in a thermal oxidation ambient to form a silicon dioxide layer of 800 Angstroms on the surface of the polycrystalline silicon body 144. The conditions of the thermal oxidation were as follows: 925° C., 20 mins., in a wet HCL (1:1) thermal oxidation ambient. A silicon nitride layer of 500 Angstroms in thickness was deposited by chemical vapor deposition at 1000° C. using SiH$_4$+NH$_3$ in H$_2$ carrier. A second polycrystalline silicon layer was deposited having a thickness of 7,000 Angstroms by low pressure chemical vapor deposition at 625° C. using SiH$_4$ in a N$_2$ carrier. The second polycrystalline silicon layer was placed in a reactive ion etching ambient having the following conditions: SF$_6$+Cl$_2$ (7.5%, 2.5%) in He (90%) etch in a parallel plate reactor at about 0.14–0.18 watts/cm$^2$ at about 50–100 microns pressure to form the pattern of narrow dimehsioned dielectric regions or sidewalls 145. The second polysilicon layer was oxidized to form a surface silicon dioxide on the sidewall which resulted in the final sidewall structure of FIG. 15A. The FIGS. 15A through 15F and 16 are scanning electron micrographs at a magnification of from 3,000X to 20,000X. The thin, about 500 Å silicon nitride layer which functions as the etch stop and oxidation barrier during sidewall reactive ion etching and reoxidation is removed by reactive ion etching in a parallel plate reactor using an ambient of CF$_4$, or the like, at about 40 microns pressure and a power density in the range of 0.18 to 0.26 watts/cm$^2$ with a gas flow of 20–40 cc/min. Reactive ion etching prevents undercutting of the contact region. The remaining Si$_3$N$_4$ layer over the polysilicon is removed using heated (165° C.) H$_3$PO$_4$. The polycrystalline layer 144 is removed by use of a pyrocatechol etching solution heated to about 115° C. The etching solution contains ethylenediamine, pyrocatechol, and de-ionized water in the ratio of 7.5 ml : 2.5 gm : 1 ml. The result of this process is the structure of FIG. 15B which shows the pattern of narrow dimensioned dielectric regions or sidewalls on the insulating layer 142. A blanket aluminum layer 150 is vacuum deposited over the entire surface 142, 145. The thickness of this aluminum layer is about 8,000 Angstroms. FIG. 15C illustrates an actual cross-sectional enlargement of this structure wherein the narrow dimensioned composite region is formed of silicon dioxide 152, silicon nitride 153, second polycrystalline silicon layer 154 and silicon dioxide layer 155 formed from the oxidation of the second polycrystalline silicon layer. A polyimide layer 157 is applied by the conventional spin-on process. The structure is reactive ion etched in a parallel plate reactor using an oxygen ambient at about 40 microns of Hg pressure and an input power of 500 watts. The FIG. 15D shows a cross-sectional view of the structure after the polyimide etch step. The white block in the photograph is a piece of silicon which was produced during sample preparation. The block is not a defect in the original structure. The metal layer is etched using a solution comprising 800 ml phosphoric acid, 50 ml nitric acid, 50 ml acetic acid, 100 ml deionized water, and 2–3 ml of surfactant at a temperature of 45° C. FIG. 15E shows the post-metal etch structure from a top view. The remaining polyimide layer 157 is removed by an oxygen ashing process typically using a barrel type plasma etch tool, an oxygen ambient and an input power of 300–400 watts. The final structure is shown in FIG. 15F wherein the metal sidewall or narrow dimensioned region 145 isolates the metal contact regions 160 and 162 from one another.

During RIE of the first polysilicon layer 144, etching of the epitaxial silicon body 140 is prevented by the first insulating layer such as silicon dioxide layer 142 acting as an etch stop due to the greater than 10:1 etch rate ratio of polysilicon to thermal silicon dioxide. The 800 Å SiO$_2$ and 500 Å Si$_3$N$_4$ films grown after etching of the first polycrystalline silicon layer 142 provide passivation for the emitter-base junctions. In addition, the 500 Å Si$_3$N$_4$ film acts as an etch stop and contact oxidation barrier during sidewall fabrication. The second polycrystalline silicon deposition primarily defines the width of the narrow dimensioned insulating region. The 3,700 Å reoxidation layer 155 protects the second polycrystalline silicon layer 154 during first polycrystalline silicon stripping. All other areas are also protected during first polycrystalline silicon strip by either the SiO$_2$ or the SiO$_2$/Si$_3$N$_4$ layer. FIG. 15B clearly shows the excellent integrity of the resulting pattern of narrow dimensioned regions or studs 145.

After metal deposition, as shown in FIG. 15C, the metal 150 is substantially thinner over the sides of the stud 145. The metal line width between studs has been reduced to 1.4 μm from a 3.0 μm photolithography defined opening. Stud width for these samples is 0.8 μm and the height is about 1.1 μm. FIGS. 15D and 15E demonstrate the selective exposure and removal of the metal peaks.

Figure 17:
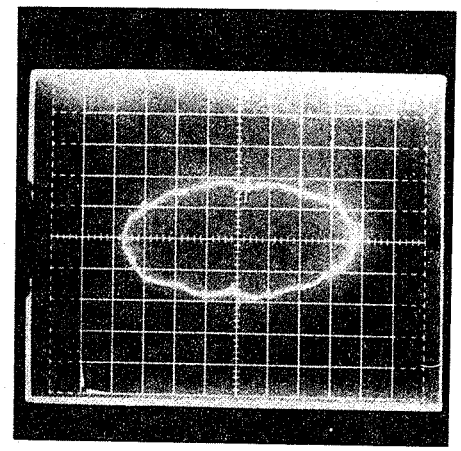
FIG. 17 shows the results of a continuity test for the test pattern of FIG. 16.

The final structure is seen in FIG. 15F. All metal has been removed from the top of the studs 145 achieving complete separation of adjacent metal lines 160, 162. An electrical continuity test was performed on several differently shaped structures, as shown in FIG. 16. No metal shorts were found and the structure failed only after the first insulating silicon dioxide layer 142 breakdown occurred at about 25 volts. A curve tracer photograph of the continunity test is shown in FIG. 17.

A free standing sidewall stud structure has also been fabricated. During reactive ion etching and polycrystalline silicon etching of the sidewall 145, the underlying epitaxial layer 140 is not attacked due to the presence of an SiO$_2$ film 142 in all areas. The stud height was 1.1 μm and the width was 0.8 μm.

Further, it has been demonstrated that selective exposure and removal of the metal 150 over the stud 145 areas can be achieved to obtain separation of metal lines. The metal line widths can be reduced by 1.6 μm from nominal value (3 μm to 1.4 μm). In addition, complete metal coverage is obtained in all contact areas. All metal images were retained independently of their size after "peak" metal etch.

Referring now to FIGS. 18A–18E, an improved method of forming integrated bipolar transistors having a self-aligned polysilicon base contact is illustrated. In contrast with the method illustrated in FIGS. 9A–9H wherein polysilicon layer 102 is employed as a support during formation of a freestanding sidewall stud (FIG. 9F) and is then removed (FIG. 9G) and replaced with contact metallurgy (FIG. 9H), the process illustrated in FIGS. 18A–18E employs doped polysilicon layer 202 as a self-aligned base contact. The polysilicon layer is not removed after sidewall formation. This process is compatible with known RIE processes, so that the bipolar transistors produced thereby do not suffer from emitter or base region thinning (which degrades transistor parameters) or from passivation layer pinholes (which short-circuits metal contact lines), as will be described below.

Figure 18A:
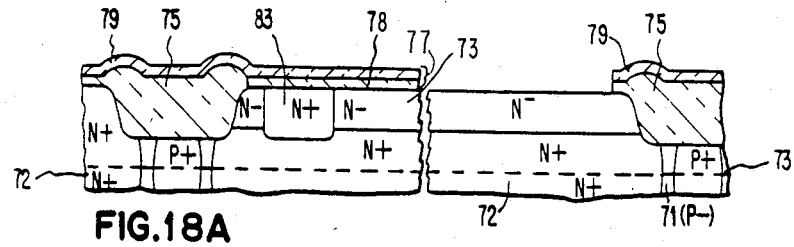
FIG. 18A-18E illustrate another method embodiment and resulting structure for forming products according to the present invention.

Referring now to FIG. 18A, there is illustrated a greatly enlarged portion of an integrated circuit at an intermediate stage of its manufacture. The FIG. 18A structure has been manufactured in a manner similar to that described in FIG. 9A with two major exceptions. The first major exception is that P+ base region 80 is absent from the integrated structure of FIG. 18A. This is because a base which is self-aligned with the polysilicon base contact structure is formed as an integral part of the present process, as will be described in connection with FIG. 18C. If a self-aligned base is not required, the base can be formed in the manner shown in FIG. 9A. A second major difference is that thermally grown silicon dioxide layer 78 and chemical vapor deposited silicon nitride layer 79 are not opened up over the N+ collector reach-through region 83.

Figure 18B:
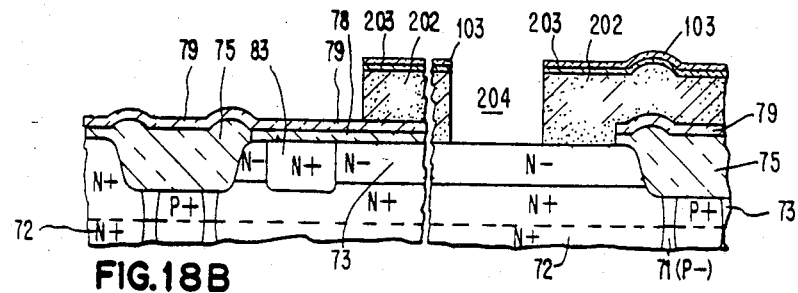

Referring now to FIG. 18B, a first layer 202 of P+ doped polysilicon is formed on the bare surface of the integrated circuit over at least a portion of epitaxial region 73. The preferred method of forming polysilicon layer 202 is similar to that described with regard to polysilicon layer 102 of FIG. 9B with certain exceptions. The major exception is that polysilicon layer 202 is P+ doped because it is the base contact for the transistor. P+ polysilicon doping may take place via ion (typically boron) implantation, diffusion of P dopants (typically $BBr_3$), or in situ growth by employing P dopants (typically $B_2H_6$) in the polysilicon itself, according to well known processes. When polysilicon doping takes place by ion implantation, it is preferred to form a thin (approximately 1600 Å) layer 203 of reoxidized polysilicon (silicon dioxide), through which ion implantation takes place. When diffusion is used, silicon dioxide layer 203 is also formed to act as an interface between doped polysilicon layer 202 and subsequently formed silicon nitride layer 103. A second exception is that silicon dioxide layer 100 shown in FIG. 9B is not grown over the exposed part of the epitaxial region 73 in FIG. 18B. This is because polysilicon layer 202 is the base contact for the transistor and must be in electrical contact with the bare silicon semiconductor surface. A final exception is that the preferred thickness of first polysilicon layer 202 is approximately 4000 Å.

The structure is put into a reactive ion etching ambient as described in connection with FIG. 9B to form an opening 204 in first polysilicon layer 202 over epitaxial region 73, to expose the surface of the semiconductor substrate. A thin (approximately 1600 Å) layer of silicon nitride 103 is utilized as the etch mask for the first polysilicon layer, as well as for passivation thereof.

Figure 18C:
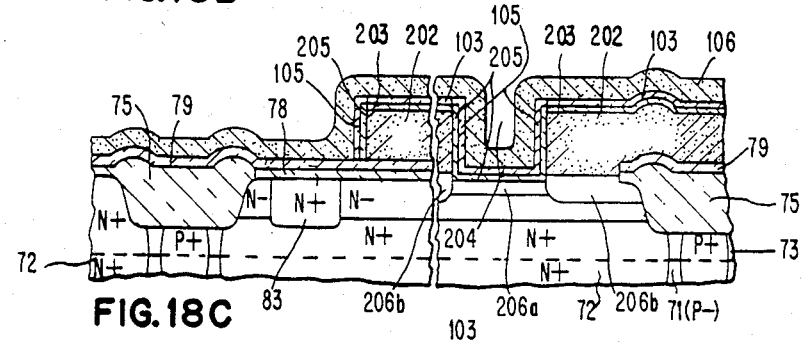

Referring now to FIG. 18C, the base region is formed. One method of base formation employs ion (typically boron) implantation of intrinsic base 206a through the opening 204 in first polysilicon layer 202. Prior to ion implantation, a thin (approximately 500 Å) layer of silicon dioxide 205 may be formed by a conventional thermal oxidation of the unmasked surfaces of polysilicon layer 202 and the exposed surface of the semiconductor substrate. Silicon dioxide layer 205 acts as a base screen oxide to reduce contamination of the exposed semiconductor surface by sputter or other contaminants. During the thermal oxidation step, P type dopant in polysilicon layer 202 diffuses into epitaxial region 73 to form extrinsic base region 206b.

A second method of base formation employs diffusion (typically $BBr_3$) of instrinsic base 206a through the opening 204 in the first polysilicon layer. During the diffusion step, P type dopant in polysilicon layer 202 diffuses into epitaxial region 73 to form extrinsic base region 206b. A thin (approximately 500 Å) layer of silicon dioxide 205 may be then formed by a conventional thermal oxidation of the unmasked surfaces of polysilicon layer 202 and the exposed surface of the semiconductor substrate. Silicon dioxide layer 205 acts as an interface between the silicon substrate and the silicon nitride to be subsequently deposited, and as an added passivation layer for the exposed surface of epitaxial layer 73.

A thin (approximately 500 Å) silicon nitride layer 105 is then chemically vapor deposited by conventional techniques over thermal oxide layer 205. Alternately, if thermal oxide layer 205 is not used, silicon nitride layer 105 is deposited directly on the wall of opening 204 and over the surface of epi layer 73 within the opening. It will be noted that the thin silicon nitride layer may be deposited over the remainder of the structure as well, thus adding approximately 500 Å to the thickness of silicon nitride layers 79 and 103. In either case, a continuous conformal coating of silicon nitride is formed over the entire exposed surface of the structure.

A second polysilicon conformal layer 106 is then deposited over the silicon nitride coating, resulting in the structure of FIG. 18C. The FIG. 18C structure is placed in an RIE ambient which is the same as the process for etching first polysilicon layer 102. A typical etch process is performed in an RF parallel plate reactor using $SF_6+Cl_2$ in an He carrier at a system pressure of 70-120 microns of Hg and an input power density of 0.14 to 0.18 watts/$cm^2$. The flow range is 20-50 cc/min of 2.5:7.5:90.0 $SF_6$: $Cl_2$:He. The ERR of polycrystalline silicon:silicon nitride is greater than 10:1. The resulting structure is shown in FIG. 18D wherein second polysilicon layer 106 on the wall of opening 204 remains, while the remainder of the second polysilicon layer over first polysilicon layer 102 and over intrinsic base region 206a is removed.

Figure 18D:
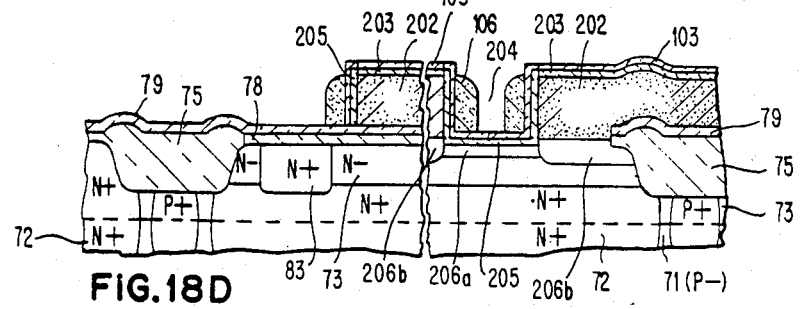
Figure 18E:
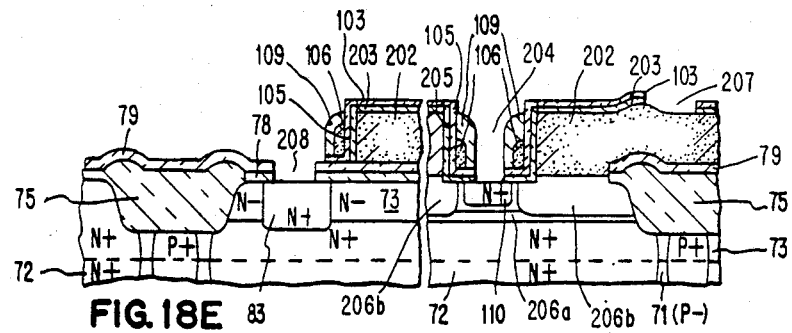

The FIG. 18D structure is then thermally oxidized at conventional temperature to oxidize the surface of second polysilicon layer 106 into silicon dioxide layer 109, as shown in FIG. 18E. Alternatively, the entire polysilicon region 106 can be converted into silicon dioxide (not shown). The emitter contact may then be opened using $CF_4$ reactive ion etch to remove $Si_3N_4$ layer 105 followed by a wet chemical etch to remove thermal $SiO_2$ layer 205 (if present) within opening 204. The N+ emitter region 110 is then formed, for example, by a thermal diffusion using arsenic or phosphorus dopant, or by ion implantation through a thin screen oxide using arsenic or phosphorus. After emitter formation, a conventional annealing cycle (e.g., 60 min at 950° C.) is performed to drive emitter region 110, intrinsic base region 206a and extrinsic base region 206b to their proper depths shown in FIG. 18E. A photoresist mask may then be used to define all remaining contact openings (e.g., base contact opening 207 and/or collector contact opening 208). Etching of these openings is typically accomplished using reactive ion etching. Metallization of these contacts may be accomplished using conventional techniques.

The following will be noted with regard to the process described with regard to FIGS. 18A-18E:

1. In contrast with the process described with regard to FIGS. 9A-9H, the first polysilicon layer is not used as a support for dielectric studs and then subsequently removed. Rather, the first polysilicon layer forms a self-aligned base contact for the bipolar transistor.

2. The process described with regard to FIGS. 18A-18E forms a bipolar transistor having a polysilicon base contact which is self-aligned to the base region, and an emitter region which is also self-aligned with regard to the base and emitter contact. As such, high performance compact transistors are formed.

3. The RIE employed for etching the second polysilicon layer need only possess a high ERR of silicon to silicon nitride. This is easily attainable using conventional RIE processes. As a result, thinning of the silicon nitride passivating layer will not take place, nor will thinning of the semiconductor substrate in the base (or emitter) regions.

4. The process described with regard to FIGS. 18A–18C may be employed whenever it is necessary to form an insulator on the wall of an opening in a polysilicon layer which lies on the surface of a semi-conductor substrate. The insulator may be formed by forming a conformal silicon nitride layer on the wall of the opening and over the surface of the semiconductor substrate within the opening. A second polysilicon layer may then be deposited on the silicon nitride conformal coating, reactive ion etched and thermally oxidized.

While the invention has been particularly shown and described with reference to the preferred embodiments thereof, it will be understood by those skilled in the art that various changes in the form and details may be made therein without departing from the spirit and scope of the invention.

I claim:

1. In an integrated circuit transistor having base and emitter regions formed in a semiconductor substrate and a junction therebetween, a polysilicon base contact and dielectric isolation structure for the base-emitter junction at a surface of said substrate, comprising:

a polysilicon base contact on the surface of said substrate overlying a portion of the base region, said base contact having substantially vertical sidewalls near the base-emitter junction and said emitter being self-aligned to said base contact; and a dielectric isolation region extending upward from the surface of said substrate adjacent said polysilicon base contact, and extending over the base-emitter junction, comprising:

a silicon nitride layer overlying said base-emitter junction and completely covering the vertical sidewalls of said polysilicon base contact, a polysilicon layer overlying said silicon nitride layer and extending upward from the horizontal surface thereof overlying said base-emitter junction, and a silicon dioxide layer formed on the surface of said polysilicon layer.

* * * * *

UNITED STATES PATENT AND TRADEMARK OFFICE
CERTIFICATE OF CORRECTION

PATENT NO. : 4,691,219

DATED : September 1, 1987

INVENTOR(S) : George R. Goth

It is certified that error appears in the above-identified patent and that said Letters Patent is hereby corrected as shown below:

Column 5, line 67, "394" should be $3\sigma$
Column 11, line 68, after region, --90-- should be inserted
Column 11, line 8, "layer 4" should be --84--

Signed and Sealed this

Twenty-third Day of February, 1988

Attest:

DONALD J. QUIGG

*Attesting Officer*  *Commissioner of Patents and Trademarks*